United States Patent
Roberts

(10) Patent No.: US 11,334,260 B2
(45) Date of Patent: May 17, 2022

(54) ADAPTIVE MEMORY SYSTEM

(71) Applicant: Micron Technology, Inc., Boise, ID (US)

(72) Inventor: David Andrew Roberts, Wellesley, MA (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 17/070,815

(22) Filed: Oct. 14, 2020

(65) Prior Publication Data

US 2022/0113881 A1 Apr. 14, 2022

(51) Int. Cl.
*G06F 3/06* (2006.01)

(52) U.S. Cl.
CPC .......... *G06F 3/0625* (2013.01); *G06F 3/0653* (2013.01); *G06F 3/0659* (2013.01); *G06F 3/0673* (2013.01)

(58) Field of Classification Search
CPC .............................................. G06F 3/06–0689
See application file for complete search history.

(56) References Cited

U.S. PATENT DOCUMENTS

| | | | | |
|---|---|---|---|---|
| 2013/0226551 A1* | 8/2013 | Wasser | .................... | G06F 30/20 703/13 |
| 2014/0204695 A1* | 7/2014 | Rotem | ................... | G11C 5/147 365/226 |
| 2017/0156068 A1* | 6/2017 | Frenger | ................... | H04W 8/22 |
| 2019/0303002 A1* | 10/2019 | Frolikov | ............... | G06F 3/0634 |
| 2021/0303211 A1* | 9/2021 | Moon | ................... | G06F 3/0659 |

OTHER PUBLICATIONS

Joseph, et al., "Prefetching using Markov Predictors", IEEE Transactions on Computers; vol. 48, Issue: 2, Feb. 1999, 12 pages.
Lee, et al., "Cryogenic Computer Architecture Modeling with Memory-Side Studies", In the 46th Annual International Symposium on Computer Architecture (ISCA '19), Jun. 22-26, 2019, Phoenix, AZ, USA. ACM, New York, NY, USA, 14 pages.

(Continued)

Primary Examiner — Nicholas J Simonetti
(74) Attorney, Agent, or Firm — Colby Nipper PLLC

(57) ABSTRACT

Described apparatuses and methods control a voltage or a temperature of a memory domain to balance memory performance and energy use. In some aspects, an adaptive controller monitors memory performance metrics of a host processor that correspond to commands made to a memory domain of a memory system, including one operating at cryogenic temperatures. Based on the memory performance metrics, the adaptive controller can determine memory performance demand of the host processor, such as latency demand or bandwidth demand, for the memory domain. The adaptive controller may alter, using the determined performance demand, a voltage or a temperature of the memory domain to enable memory access performance that is tailored to meet the demand of the host processor. By so doing, the adaptive controller can manage various settings of the memory domain to address short- or long-term changes in memory performance demand.

35 Claims, 16 Drawing Sheets

(56) References Cited

OTHER PUBLICATIONS

Phadke, et al., "MLP Aware Heterogeneous Memory System", Design, Automation & Test in Europe; Mar. 14-18, 2011, 6 pages.
Wilkerson, et al., "Reducing Cache Power with Low-Cost, Multi-bit Error-Correcting Codes", ACM SIGARCH Computer Architecture News 38(3):83-93; 37th International Symposium on Computer Architecture (ISCA 2010), Jun. 19-23, 2010, Saint-Malo, France, 11 pages.

* cited by examiner

ADAPTIVE MEMORY SYSTEM

BACKGROUND

Computers often include a processor that stores data to a main memory of the computer. For example, as a program of the computer executes on the processor, the processor accesses the main memory to store or load data of the program to or from the main memory. Thus, performance of the program executing on the computer may depend on an ability of the processor to access the main memory for the data used by the program. The ability of the processor to access the main memory can be limited by a configuration (e.g., topology, clocking, or bus width) of the main memory. As such, the processor's ability to access the main memory may be limited by the memory's configuration, which can impair performance of programs executed on the computer.

BRIEF DESCRIPTION OF THE DRAWINGS

Apparatuses of and techniques for an adaptive memory system are described with reference to the following drawings. The same numbers are used throughout the drawings to reference like features and components.

DETAILED DESCRIPTION

Overview

Figure 1:
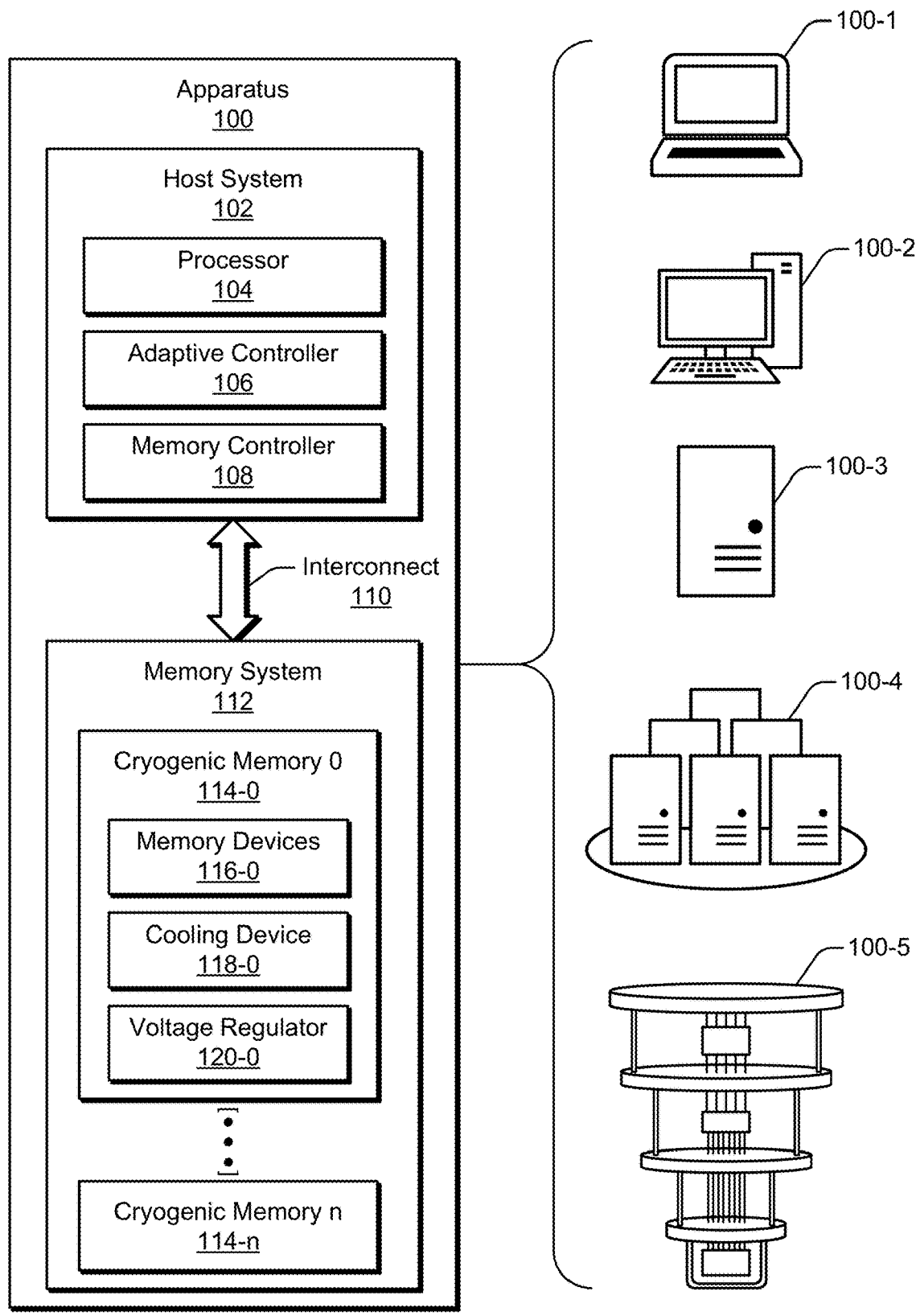
FIG. 1 illustrates an example apparatus in which an adaptive memory system can be implemented.

Computers provide services and features using a processor that is communicatively coupled to a memory. As a program of the computer executes on the processor, the processor accesses the main memory to store or load data of the program to or from the main memory. Thus, performance of the program executing on the computer may depend on an ability of the processor to access the main memory for the data used by the program. The ability of the processor to access the main memory can be limited by a configuration (e.g., frequency or voltage setting) of the main memory, which configuration may be static and determined when the computer is designed or manufactured. In some cases, the main memory of the computer is configured to provide memory access that is suitable for a program with a specific memory access pattern. Most computers, however, execute multiple programs with different respective memory access patterns or a program with a memory access pattern that change over time. As such, with a static configuration, access provided to the main memory of the computer is often mismatched for memory access patterns of many programs, which can impair performance of these programs when executed on the computer.

In contrast with the preceding memory designs having static configurations, this disclosure describes aspects of an adaptive memory system in which operating parameters or conditions of a memory domain are altered based on host access of the memory domain. For example, an adaptive controller of a memory system can monitor a memory performance metric regarding host access of a temperature-controlled memory domain. Based on the memory performance metric, the adaptive controller can determine (e.g., predict) a memory performance demand of the temperature-controlled memory domain. The adaptive controller can then alter a voltage setting or a temperature setting of a temperature-controlled memory domain based on the determined memory performance demand of the temperature-controlled memory domain. In some cases, the adaptive controller increases the voltage setting or decreases the temperature setting of the temperature-controlled memory domain to increase performance of the memory domain, such as when the performance demand of the memory domain exceeds performance provided by current operating conditions. In other cases, the adaptive controller decreases the voltage setting or increases the temperature setting of the temperature-controlled memory domain to reduce energy consumption of the memory domain, such as when the performance demand is less than the performance provided by current operating conditions. Thus, the adaptive controller can balance memory performance and energy consumption of the temperature-controlled memory domain based the host's access of the memory domain to increase energy efficiency of the computing system relative to a given level of performance.

In the context of memory performance relative to temperature, a voltage sensitivity of some memory technologies, such as dynamic random-access memory (DRAM) may be greater at temperatures less than room temperature. Additionally, low operating temperatures may also affect semiconductor-level physics of a memory device, with cooled (e.g., cryogenic) memory having appreciably reduced latency and power consumption. In aspects, this enables the adaptive controller to use voltage and/or temperature of a memory domain to control and optimize performance of the memory domain for short-term or long-term changes in memory access (e.g., access intensity). For example, the adaptive controller may adjust voltage for changes in short-term memory access intensity and temperature for longer-term changes in memory access intensity. Because some memory operations of the host and phases of software execution are bandwidth- or latency-sensitive while others are not, there is variability in host memory sensitivity (e.g., bandwidth or latency sensitivity), which the adaptive controller can monitor through memory performance metrics of the host or a processor of the host. Based on the memory sensitivity of the host or software, the adaptive controller may determine (e.g., predict) a memory performance demand of the memory domain. The adaptive controller can use the memory performance demand to adapt the performance of the memory domain to the variations of memory sensitivity by controlling the voltage or temperature of the memory domain. Further, there is an energy cost associated with cooling the memory domain, which can be traded off against memory performance by adjusting the temperature (e.g., cooling power level). As such, the described adaptive controller can balance memory performance and energy consumption according to the changing memory performance demands of the software executing on the host to reduce the costs of operating a computing system, such as a large-scale data center or a quantum computer.

In aspects, an adaptive controller alters a voltage or a temperature of a temperature-controlled memory domain to balance memory performance and energy use. In some implementations, an adaptive controller monitors memory performance metrics of a host processor that correspond to commands or requests made to a memory domain (e.g., temperature-controlled memory domain) of a memory system, including one operating at cryogenic temperatures. Based on the memory performance metrics, the adaptive controller can determine (e.g., predict) memory performance demand of the host processor, such as latency demand or bandwidth demand, for the memory domain. The adaptive controller may alter, using the determined memory performance demand, a voltage or a temperature of the memory domain to enable memory access performance that is tailored to meet the memory performance demand of the host processor. Alternatively or additionally, the adaptive controller may adjust an error-correcting code applied to the data of the memory domain to address changes in memory reliability that result from altering the voltage or the temperature of the memory. By so doing, the adaptive controller can manage various settings of the memory domain to address short- or long-term changes in memory performance demand. These are but a few example aspects of an adaptive memory system, others of which are described herein.

Example Operating Environment

FIG. 1 illustrates an example apparatus 100 in which an adaptive memory system can be implemented. The apparatus 100 can be realized as, for example, at least one electronic device. Example electronic-device implementations of the apparatus 100 include a notebook computer 100-1, a desktop computer 100-2, a server computer 100-3, a server cluster 100-4, and a quantum computing system 100-5. Other apparatus examples include an entertainment device, such as a set-top box or a smart television; a motherboard or server blade; a rack-based compute and/or memory resource; a consumer appliance; vehicles; industrial equipment; and so forth. Each type of electronic device includes one or more components to provide some computing functionality, service, or feature.

In example implementations, the apparatus 100 includes at least one host 102 (e.g., host system or host device), at least one processor 104, and an adaptive memory controller 106 (adaptive controller 106). The apparatus 100 also includes at least one memory controller 108, at least one interconnect 110, and a memory system 112 (e.g., memory array) that includes at least one cryogenic memory 114. The interconnect 110 logically couples the host 102 to the memory system 112 and enables the host 102 or components thereof to transfer data to or from the memory system 112. In the illustrated example, the memory system 112 of the apparatus 100 includes cryogenic memory 0 114-0 through cryogenic memory n 114-$n$, where n is any suitable integer. An instance of the cryogenic memory 114 may include one or more memory devices 116, a cooling device 118, a voltage regulator 120, a clock circuit (not shown), a sensor (not shown), or the like. Generally, the cooling device 118 of the cryogenic memory 114 provides a thermal domain into which the one or more memory devices 116 are grouped as a temperature-controlled memory domain (or region). The one or more memory devices 116 may also operate from a voltage domain (e.g., shared operating voltage) provided by a voltage regulator 120, such that a temperature or a voltage of the temperature-controlled memory domain are independently configurable by the adaptive controller 106. As shown in FIG. 1, the cryogenic memory 114-0 is implemented with memory devices 116-0, a cooling device 118-0, and a voltage regulator 120-0, which correspond to one temperature-controlled memory domain of the memory system 112. Other examples of memory systems 112 and temperature-controlled memory domains are described herein.

A cryogenic memory 114 may be implemented with any suitable type, configuration, number, or combination of memory devices 116. The memory devices 116 of a cryogenic memory 114 may include dynamic random-access memory (DRAM), synchronous DRAM (SDRAM), static RAM (SRAM), Flash memory, or the like. In some cases, the memory devices 116 include a three-dimensional (3D) stacked DRAM device, such as a high bandwidth memory (HBM) device or a hybrid memory cube (HMC) device. Additionally or alternatively, the memory devices 116 can include storage-class memory devices, such as one employing 3D XPoint™ or phase-change memory (PCM). The memory devices 116 of a cryogenic memory 114 can be configured or organized as an array of devices, modules (e.g., dual-inline memory modules (DIMMs)), cards, chips, dies, or the like. These are but a few examples of cryogenic memories 114, others of which are described herein.

As shown in FIG. 1, the host 102, or host system 102, includes the processor 104, the adaptive controller 106, and memory controller 108. Although not shown, the host 102 may also include one or more cache memories coupled to the processor 104. The processor is coupled to the adaptive controller 106 and coupled, directly or indirectly, to the memory controller 108. The host 102 is coupled to the memory system 112 via the interconnect 110. In various aspects, the adaptive controller 106 may also be coupled to the memory controller 108 and/or the interconnect 110.

The depicted components of the apparatus 100 represent an example computing architecture that includes an adaptive memory system. The memory system 112 is logically coupled to the host 102 via the interconnect 110 and may serve as a main memory for the processor 104 of the apparatus 100. The indicated interconnect 110, as well as the other interconnects that communicatively couple together various components, enable data to be transferred between or among the various components. Interconnect examples include a bus, a switching fabric, one or more wires that carry voltage or current signals, and so forth.

Although particular implementations of the apparatus 100 are depicted in FIG. 1 and described herein, an apparatus 100 can be implemented in alternative manners. For example, the apparatus 100 may include multiple memory systems 112 (e.g., cryogenic memory racks) coupled to the host 102 via separate respective interconnects 110. In some implementations, a memory system 112 is coupled to a host 102 via a first interconnect 110 and coupled to an interface of a quantum processor or quantum substrate via a second interconnect 110. Other examples of these and other apparatuses are depicted and described herein. Nonetheless, the components described herein may be implemented in alternative ways, including in distributed or shared memory systems. Further, a given apparatus 100 may include more, fewer, or different components.

Figure 2:
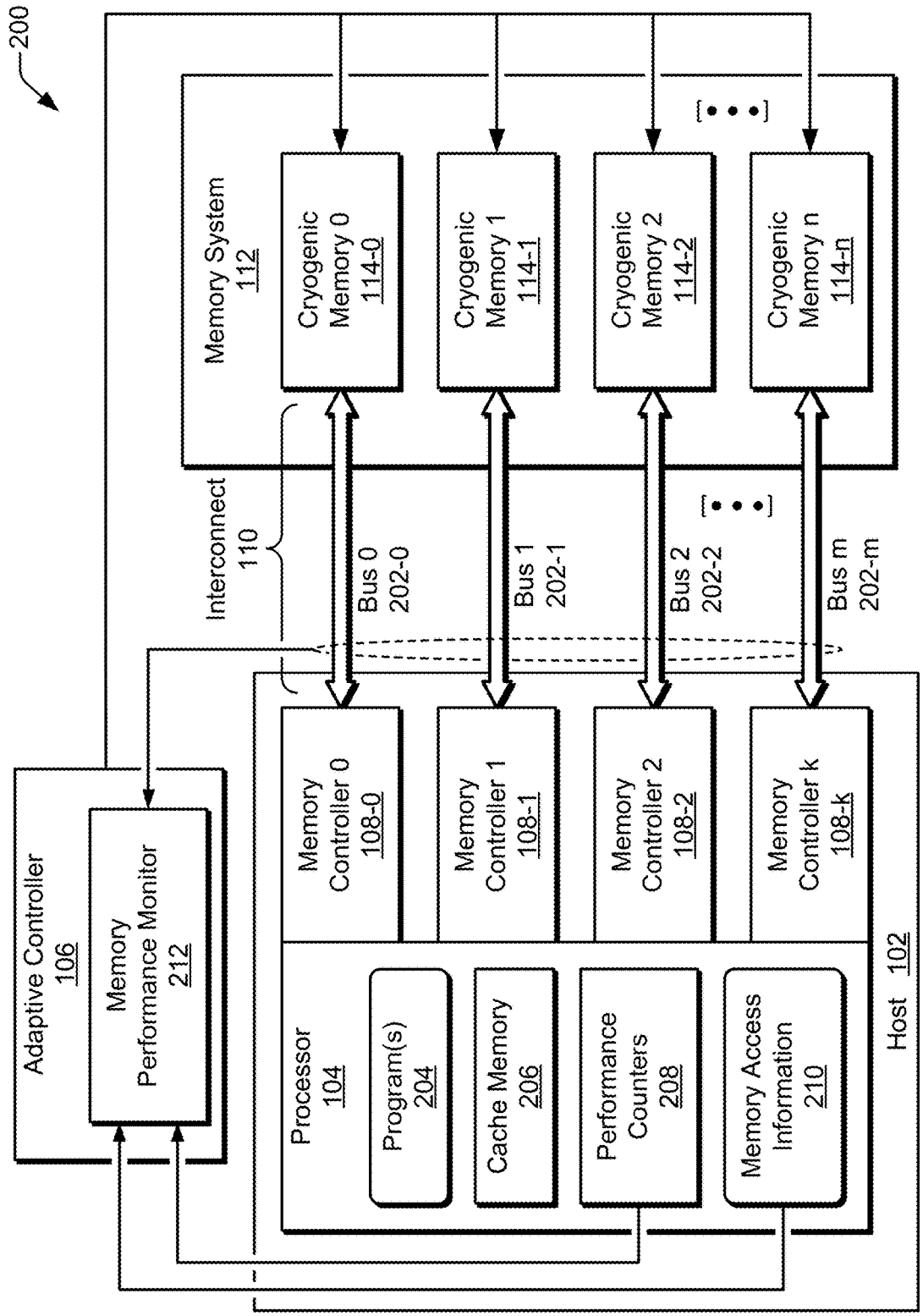
FIG. 2 illustrates an example adaptive memory system in which a host processor is coupled to a cryogenic memory via a multi-bus interconnect.

FIG. 2 illustrates, generally at 200, an example implementation of an adaptive memory system in which a processor 104 (e.g., host processor) of an apparatus (e.g., apparatus 100) is coupled to the memory system 112 via a multi-bus interconnect 110. In this example, the adaptive controller 106 is implemented separately from and coupled, via a host interface, to the host 102 on which the processor 104 is implemented. Thus, the adaptive controller 106 may be implemented as a separate component, as part of the memory system 112, or as part of the interconnect 110 between the host 102 and memory system 112. In other implementations, the processor 104 and adaptive controller 106 are implemented on a same host 102 (e.g., FIG. 1) and may share logic or processing resources of the host 102.

The host 102 is coupled to the memory system 112 via the interconnect 110, which enables the processor 104 to transfer data to or from the memory system 112. Here, the interconnect 110 is implemented as a multi-bus interconnect 110 with multiple buses 202, which include bus 0 202-0, bus 1 202-1, bus 2 202-2, through bus m 202-m, where m is any suitable integer. Although not shown, a bus 202 of the interconnect may be further separated into at least an address bus and a data bus useful to perform memory transactions via the interconnect 110. Accordingly, the processor 104 or memory controller 108 can communicate memory address information via the address bus and data via the data bus of the interconnect 110. Memory requests, such as commands, messages, or instructions, can be communicated on the interconnect 110, a bus 202, an address bus, a data bus, a command bus (not shown), or a combination thereof.

An interconnect 110 or a bus 202 coupling the host 102 to the memory system 112 may be configured to operate over any suitable type of interface or protocol. In some cases, the interconnect 110 includes a serialized interface, such as a serializer/deserializer-based (SerDes-based) memory interface that includes serialization and deserialization components at respective endpoints of the interconnect 110 or bus 202. Through a SerDes-based memory interface, the host 102 can implement a split-transaction memory access protocol to store data to or read data from the memory system 112. Further, the SerDes-based memory interface can operate at a fixed high frequency, independent of a latency or a bandwidth of the cryogenic memories 114 of the memory system 112. In other implementations, the interconnect 110 or bus 202 can be configured as a bus-based (e.g., a DDR-compliant) interface that enables the host 102 and the memory system 112 to exchange data or other information through parallel transfer operations. At initialization or across changes in operational settings of the interconnect 110, a memory controller 108 of the host 102 may re-train and configure a SerDes- or bus-based interconnect 110.

An interconnect 110 can also operate in accordance with one or more standards. Example standards include DRAM standards published by the Joint Electron Device Engineering Council (JEDEC) (e.g., Double Data Rate (DDR), DDR2, DDR3, DDR4, DDR5, etc.); stacked memory standards, such as those for HBM or HMC; a peripheral component interconnect (PCI) standard, such as the Peripheral Component Interconnect Express (PCIe) standard; the Compute Express Link (CXL) standard; the HyperTransport™ standard; the InfiniBand standard; and the External Serial AT Attachment (eSATA) standard. In addition or in alternative to a wired connection, the interconnect 110 may be or may include a wireless connection, such as a connection that employs cellular, wireless local area network (WLAN), wireless personal area network (WPAN), or passive network standard protocols.

The interconnect 110 couples, directly or indirectly, the processor 104 of the host 102 to the cryogenic memories 114 (e.g., temperature-controlled memory domains) of the memory system 112. As shown in FIG. 2, the processor 104 is coupled to the interconnect 110 via multiple respective memory controllers 108-0, 108-1, 108-2, through 108-k, where k is any suitable integer. The buses 202-0 through 202-m of the interconnect 110 couple the memory controllers 108-0, 108-1, 108-2, through 108-k to respective ones of cryogenic memories 114-0, 114-1, 114-0 through 104-n of the memory system 112. In some cases, the processor 104 is coupled to each cryogenic memory 114 by a respective memory controller 108 and bus 202 of the interconnect (e.g., integers k, m, and/or n being equal). In other cases, the processor 104 can be coupled to multiple cryogenic memories 114 via a memory controller 108 and/or multiple buses 202 (e.g., integers k, m, and/or n being unequal). As such, the host 102, interconnect 110, and memory system 112 can be configured in various ways to enable aspects of adaptive memory.

The example host 102 of FIG. 2 includes the processor 104 and memory controllers 108-0 through 108-k through which the processor 104 accesses the memory system 112. Accordingly, to access data of one of the cryogenic memories 114, the processor 104 or a respective memory controller 108-0 through 108-k issues or sends a memory request over a corresponding bus 202-0 through 202-m of the interconnect 110. The processor 104 and memory controllers 108 may be physically separate devices (e.g., separate chips or chiplets) or may be different elements of a single device, such as a central processing unit (CPU), graphics processing unit (GPU), quantum processor, application-specific integrated circuit (ASIC), field-programmable gate array (FPGA), or the like. In aspects, the processor 104 includes one or more programs 204, at least one cache memory 206 (e.g., data and/or instructions caches), and performance counters 208. The programs 204 of the host include processor-executable instructions that the processor 104 executes to provide functionalities, or services of the host 102. Although illustrated in association with the processor 104, the programs 204 can be stored by and loaded from one of the memories or a data storage device (e.g., non-volatile memory) of the host 102. Further, data (not shown) used by the programs 204 may be stored by and loaded from one of the memories or the data storage device of the host 102.

When executing the programs 204, the processor 104 of the host 102 implements memory operations to access the data used by the programs to operate. Generally, the memory operations include read operations to read data stored in memory and write operations to store data in memory. With reference to read operations, in response to execution of a program 204, the processor 104 determines which data is needed by the program 204, such as to advance execution of the program. In some cases, the processor 104 generates memory read instructions for the data of the program. To obtain data for the program 204 (e.g., satisfy the memory read instructions), the processor 104 can access a cache memory 206 (e.g., L1, L2, or L3 cache) associated with the processor 104 or generate a command or request (e.g., memory access command or memory access request) for issuance over the interconnect 110 to obtain the data from the memory system 112. If the data of the program 204 is present in the cache 206 (e.g., a "cache hit"), the data is loaded from the cache 206 by the processor 104 for use by the program 204. In other cases, if the data of the program 204 is not found in the cache 206 (e.g., a "cache miss"), the processor 104 generates a memory request for issuance over the interconnect 110 to read the data from the memory, such as the memory system 112, of the host 102. By way of review, one or more cache misses that result in memory requests for data from memories of the host 102 may reduce performance of the program 204 while the processor 104 waits on completion of the memory request.

The processor 104 of the host 102 includes performance counters 208 that track memory performance metrics or statistics related to memory access by the processor 104 when executing one or more programs. Generally, the memory performance metrics may indicate a program's memory sensitivity or how memory access performance affects the execution of the program by the process. These memory performance metrics may include any suitable metric associated with the memory access. Examples of the memory performance metrics include an amount of time or a number of clock cycles for which one or more memory read instructions stall a reorder buffer of the processor 104, a number of cache misses for data requested by the processor 104, or a cache miss rate, such as a misses per kilo instruction (MPKI) rate for memory read operations of the processor 104. In some cases, a number of clock cycles indicates latency sensitivity of access to a temperature-controlled memory domain (e.g., due to excessive latency) and an MPKI indicates a bandwidth sensitivity of access to the temperature-controlled memory domain (e.g., due to lack of bandwidth). Alternatively or additionally, the processor 104 can include memory access information 210 that describes or indicates memory addresses for which the processor 104 or memory controller 108 issues memory requests. Accordingly, the performance counters 208 and the memory access information 210 may be useful to determine respective performance sensitivity or demand associated with the processor's memory requests issued to different memory domains (e.g., temperature-controlled memory domains) of the host 102.

As shown in FIG. 2, the adaptive controller 106 may be coupled, via respective interfaces, to the performance counters 208, the memory access information 210, and the interconnect 110 of the host 102. In some implementations, the adaptive controller 106 includes a memory performance monitor 212 that monitors memory performance metrics and memory access information 210 associated with memory requests sent or issued to the memory system 112. The memory performance monitor 212 may receive the memory access information 210 (e.g., memory request addresses) from the processor 104, one of the memory controllers 108-0 through 108-$k$, the interconnect 110, or one of the buses 202-0 through 202-$m$. In aspects, the memory performance monitor 212 receives address information for the memory requests issued by the processor 104 over the interconnect 110 to the cryogenic memories 114-0 through 114-$n$.

Based on the address information, the memory performance monitor 212 associates respective ones of the memory performance metrics with the cryogenic memory 114 (e.g., temperature-controlled memory domain) to which the memory performance metrics correspond. As such, the memory performance monitor 212 may determine a level of memory performance sensitivity or demand on one or more of the cryogenic memories 114-0 through 114-$n$ using the memory performance metrics and the memory access information 210 of the host 104. The adaptive controller 106 is also coupled with the memory system 112 to enable the adaptive controller 106 to manage various settings of the cryogenic memories 114-0 through 114-$n$, which may correspond to respective temperature-controlled memory domains. In aspects, the adaptive controller 106 manages the settings of a temperature-controlled memory domain based on the memory performance metrics and memory access information 210 of the host 102 (e.g., memory performance demand), examples of which are described herein.

Figure 3:
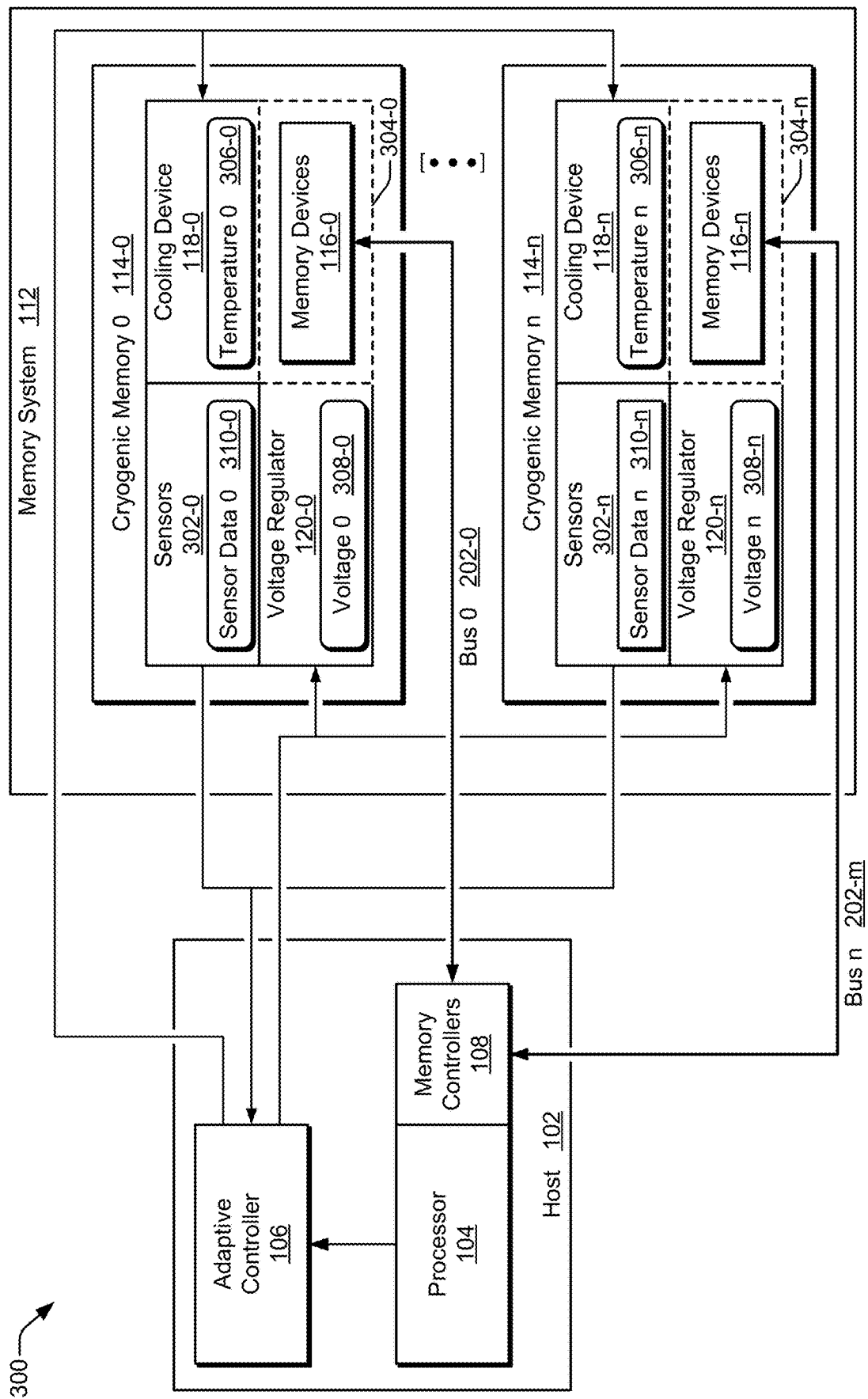
FIG. 3 illustrates an example of temperature-controlled memory domains of an adaptive memory system implemented in accordance with one or more aspects.

FIG. 3 illustrates, at 300, an example of temperature-controlled memory domains of an adaptive memory system (e.g., memory system 112) that feature independently controllable voltage and temperature. In this example, the host 102 includes a processor 104, memory controllers 108, and an adaptive controller 106, which is coupled to the processor 104 and an array of cryogenic memories 114-0 through 114-$n$ of the memory system 112. The memory controllers 108 of the host 102 couple the processor 104 to respective ones of the cryogenic memories 114-0 through 114-$n$ via buses 202-0 through 202-$m$ of an interconnect 110. For visual brevity, the cryogenic memory 114-0 and cryogenic memory 114-$n$ are shown along with corresponding buses 202-0 and 202-$m$ as a non-limiting example. The described aspects may be implemented with any suitable host system and temperature-controlled memory system, which may include fewer, additional, or different components and/or connections from than those described with reference to FIG. 2.

In aspects, a cryogenic memory 114 (e.g., 114-0) of the memory system 112 includes one or more memory devices 116 (e.g., 116-0), a cooling device 118 (e.g., 118-0), a voltage regulator 120 (e.g., 120-0), a clock circuit (not shown), and sensors 302 (e.g., 302-0). Generally, the adaptive controller 106 is coupled to the cooling device 118, the voltage regulator 120, the clock circuit, and/or sensors 302 of the cryogenic memories 114 of the memory system 112. Accordingly, the adaptive controller 106 can adaptively configure a temperature or a voltage of the cryogenic memory 114, such as to tailor performance of the cryogenic memory 114 to the memory performance demand of the host 102. To implement various aspects of adaptive memory, the adaptive controller 106 interacts with the cooling device 118, voltage regulator 120, the sensors 302, or other components of the cryogenic memory 114. Although illustrated with same components, each of the cryogenic memories 114-0 through 114-$n$ may be configured similar to or differently from one another, with more, fewer, or different components.

The cooling device 118 (e.g., active cooling device or system) of a cryogenic memory 114 provides a temperature domain in which the one or more memory devices 116 are disposed. As such, the cryogenic memory 114 or the memory devices 116 within the temperature domain of the cryogenic memory 114 are illustrated as a temperature-controlled memory domain 304 of the memory system 112. Although described in the context of cryogenic cooling, the cooling device 118 may include any suitable type of cooling device or cooling system that can selectively control (e.g., decrease or increase) a temperature of the memory devices 116. Example cooling devices 118 include a fan device, liquid-based cooling, a thermoelectric cooler (e.g., Peltier device), a liquid-gas phase-change system, a submersion or bath system, an evaporative system, or the like. In some cases, the cooling device 118 includes a liquid nitrogen- or liquid helium-based cooling device that is capable of cooling the memory devices 116 to less than 100K (e.g., cryogenic temperature range). A cooling device 118 may include a thermostat circuit or control interface through which the adaptive controller alters, adjusts, or configures a temperature setting 306 (e.g., set point register) to control a temperature (e.g., a measured or current temperature) of a temperature-controlled domain 304 of the memory devices 116.

The voltage regulator 120 provides a voltage domain from which the one or more memory devices 116 operate. The voltage regulator 120 may include a control circuit or control interface with a voltage setting 308 that the adaptive controller 106 configures to control the operating voltage of the memory devices 116 of the cryogenic memory 114. In other words, the adaptive controller 106 may selectively control, alter, or adjust temperature 306 and the voltage 308 of the temperature-controlled memory domain 304 independently from one another. In some cases, the sensors 302 of the cryogenic memory 114 measure and provides, to the adaptive controller 106, sensor data 310 that is indicative of operating conditions of the memory devices 116. For example, the sensor data 310 may indicate, for a given temperature-controlled memory domain 304, one or more of a temperature, an operating voltage, an operating frequency, an amount of energy consumed by the cooling device 118, an amount of energy consumed by the memory devices 116 (e.g., a memory voltage regulator or power supply), and so forth. The sensors 302 may be implemented separately from or integrated with the memory devices 116, cooling device 118, or voltage regulator 120 of the temperature-controlled memory domain 304.

Figure 4:
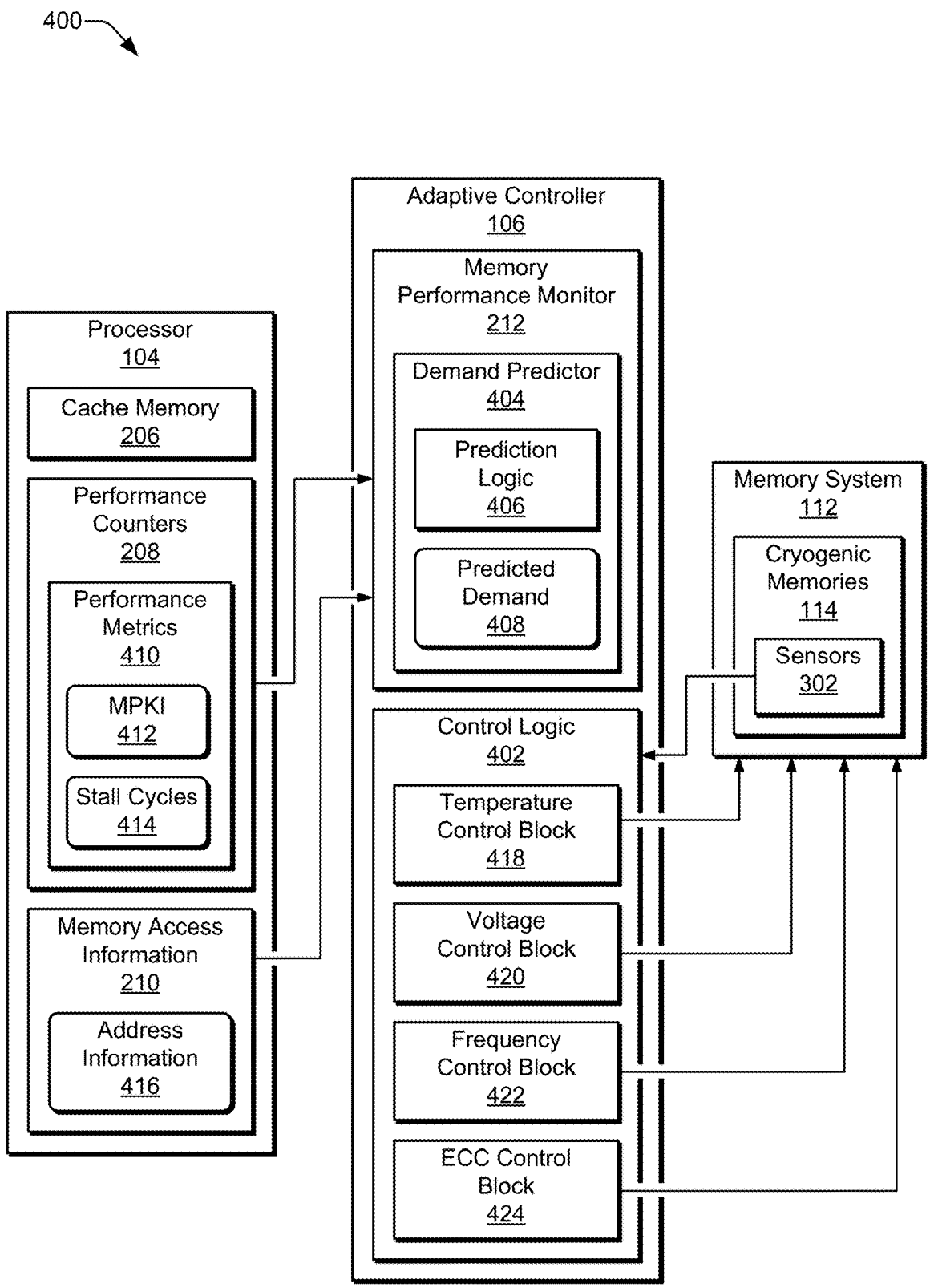
FIG. 4 illustrates an example configuration of an adaptive controller that can implement aspects of an adaptive memory system.

FIG. 4 illustrates at 400 an example configuration of an adaptive controller 106 that is coupled to a host processor 104 and a memory system 112 to implement an adaptive memory system. The adaptive controller 106 may include one or more respective interfaces (not shown) that enable interaction with components of the host 102, processor 104, the interconnect 110, or the memory system 112. In some cases, the adaptive controller 106 is implemented as hardware circuitry and/or firmware logic on the processor 104 or another processor of the host 102. The adaptive controller 106 may include an application programming interface (API) through which configurable settings (e.g., thresholds) of the adaptive controller 106 are exposed via a user interface. Alternatively or additionally, the API may link the adaptive controller 106 to a system manager of the host 102, which may enable the host 102 to synchronize power sequencing with the adaptive controller 106 or reset the adaptive controller 106.

As shown in FIG. 4, the adaptive controller 106 includes a memory performance monitor 212 that is coupled to the processor 104 and adaptive control logic 402 that is coupled to the memory system 112. Generally, the memory performance monitor 212 monitors memory performance associated with a memory domain (e.g., memory sensitivity) and predicts future memory demand based on the memory performance. The adaptive control logic 402 can use the predicted memory demand to adaptively configure the memory domain to adjust performance of the memory domain to align with the predicted memory demand. In this example, the memory performance monitor 212 is implemented with a demand predictor 404 that includes memory demand prediction logic 406 (prediction logic 406) configured to provide predicted memory demand 408 (predicted demand 408). In aspects, the memory performance monitor 212 receives memory performance metrics 410 (performance metrics 410) from the performance counters 208 of the processor 104. Here, the performance metrics 410 include an indication of MPKI 412 and an indication of stall cycles 414 for instructions of the programs 204 executing on the processor 104. The MPKI 412 may indicate memory bandwidth sensitivity of access by a program or a processor to a temperature-controlled memory domain. The stall cycles 414 may indicate memory latency sensitivity of access by a program or a processor to a temperature-controlled memory domain, The memory performance monitor 212 may also receive memory access information 210 from the processor 104 or a memory controller 108 of the host 102. The memory access information 210 includes information, such as address information 416, that is useful to correlate memory requests, performance metrics, or memory sensitivity with a respective one of the cryogenic memories 114, a temperature-controlled memory domain, or another memory coupled to the host 102 via the interconnect 110. Alternatively or additionally, the memory performance monitor 212 can monitor activity (e.g., memory requests or data transactions) on the interconnect 110 to obtain memory access information 210 that describes access by the processor 104 or programs 204 to the memory system 112.

In aspects, the memory performance monitor 212 uses the performance metrics 410 and optionally the memory access information 210 to characterize or profile memory access performance or sensitivity for one or more of the temperature-controlled memory domains 304 of the memory system 112. For example, memory associated with a program 204 (e.g., virtual pages) executing on the processor 104 may be mapped to a temperature-controlled memory domain 304 (or temperature-controlled memory region). The memory performance monitor 212 can profile the memory access performance or sensitivity (e.g., memory sensitivity) of the program and/or other programs that access the temperature-controlled memory domain 304 during execution. Using the monitored memory access performance or sensitivity, the prediction logic 406 of the demand predictor 404 determines a predicted demand 408 for the temperature-controlled memory domain 304 for a future instance in time. Other examples of memory access demand and predicted demand 408 are described herein.

The predicted demand 408 is provided to the adaptive control logic 402, which can adjust settings of the memory system 112 to tailor performance of the cryogenic memories 114 to changes in memory sensitivity or requirements of the programs. In some cases, the adaptive control logic 402 uses the predicted demand 408 to alter or configure voltage or temperature settings of a cryogenic memory 114 to adjust bandwidth or latency of its temperature-controlled memory domain. Thus, the adaptive control logic 402 receives the predicted demand 408 from the memory performance monitor 212 and optionally sensor data received from the sensors 302 of the cryogenic memories 114. For example, the adaptive control logic 402 may also receive indications of measured temperatures, voltage, frequencies, or energy consumption of a temperature-controlled memory domain. Based on the predicted demand 408 and optionally the sensor data, the adaptive control logic 402 alters or configures a temperature, voltage, frequency, or ECC of a cryogenic memory 114. To enable interaction with the memory system 112, the adaptive control logic 402 may include a temperature control block 418, voltage control block 420, frequency control block 422, and ECC control block 424. Generally, any of the control blocks may include registers, circuitry, or an interface that enables the adaptive control logic 402 to alter or configure a respective operating parameter (e.g., temperature or voltage) of a cryogenic memory 114 or temperature-controlled memory domain 304. Other examples of these components are described herein.

Figure 5:
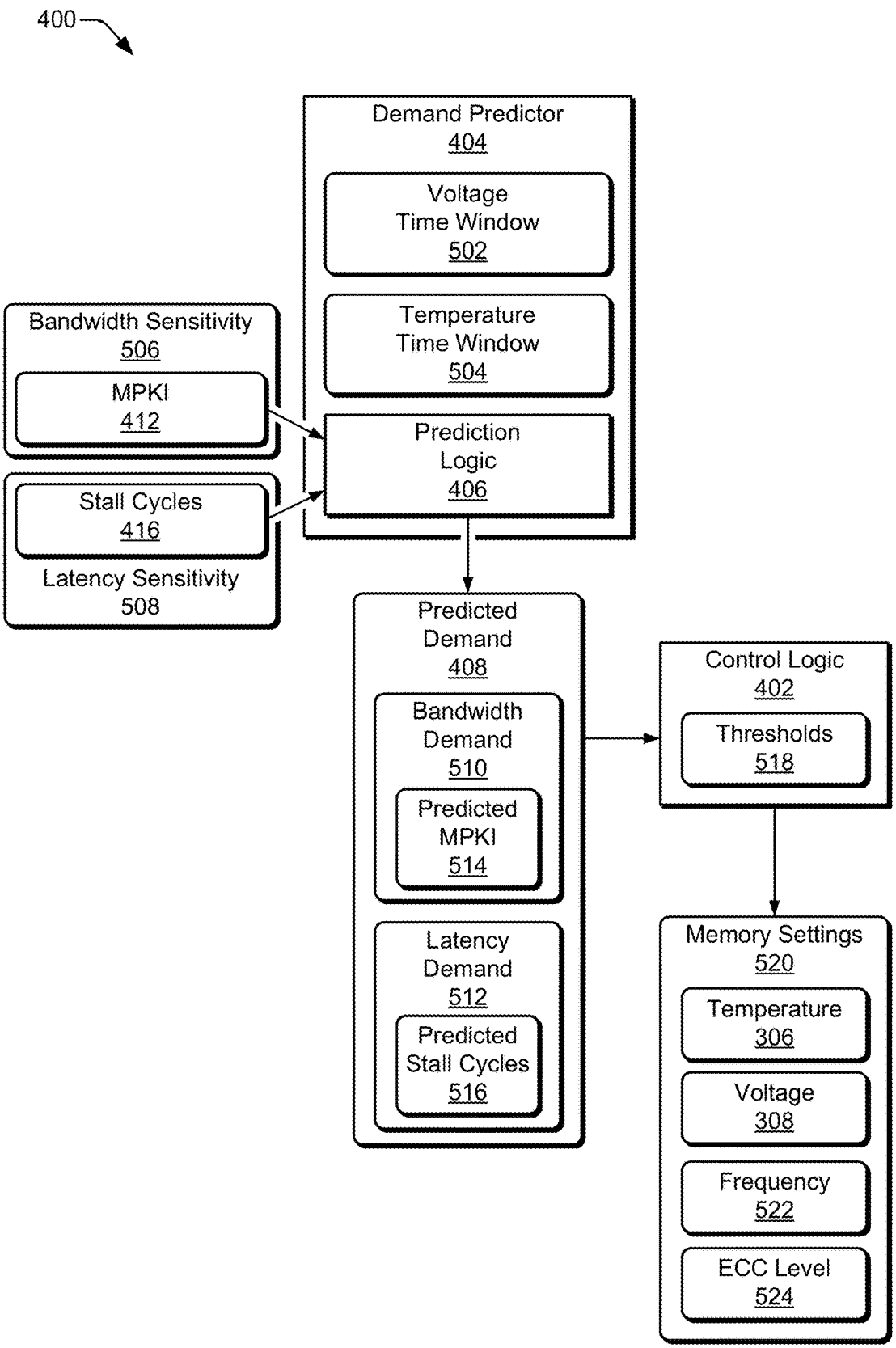
FIG. 5 illustrates an example configuration of a memory demand predictor that can predict performance of a temperature-controlled memory domain.

FIG. 5 illustrates at 500 an example configuration of a memory demand predictor and other components of the adaptive controller 106 of FIG. 4. In aspects, the memory demand predictor 404 (demand predictor 404) predicts, for one or more temperature-controlled memory domains, memory performance demand (e.g., latency or bandwidth) for a future point in time. In some implementations, the demand predictor 404 uses memory performance metrics of a previous and/or current time window to the memory performance demand for a subsequent time window. Alternatively or additionally, the demand predictor 404 may profile memory performance or sensitivity over multiple time windows to predict memory performance demand for the subsequent time window.

The demand predictor 404 includes time windows that may be pre-fined, statically configured or dynamically configured while the adaptive controller 106 operates to manage settings of the memory system 112. Alternatively, the demand predictor 404 can be configured to profile memory performance or predict demand over durations of time, time intervals, time segments, or the like. In aspects, the demand predictor 404 implements different time windows that correspond to a respective type of operational parameter (e.g., voltage or temperature) through which performance of a temperature-controlled memory domain is controllable. In this example, the demand predictor 404 includes a programmable voltage time window 502 (voltage time window 502) and a programmable temperature time window 504 (temperature time window 504). In some implementations, a length of a time window for adjusting the operating parameter of a temperature-controlled memory domain is determined based on a transition time to change performance (e.g., latency or bandwidth) to the memory domain using the operating parameter (e.g., voltage or temperature).

Generally, the demand predictor 404 receives indications of memory performance or memory sensitivity from the memory performance monitor 212. In this example, the demand predictor 404 receives, for a temperature-controlled memory domain, respective indications of bandwidth sensitivity 506 or latency sensitivity 508 for the voltage time windows 502 and the temperature time windows 504. Here, the indications of bandwidth sensitivity 506 and latency sensitivity 508 include MPKI 412 and stall cycles 414, respectively, though the demand predictor 404 may use any suitable memory performance metric. Based on the bandwidth sensitivity 506 and/or latency sensitivity 508 for the temperature-controlled memory domain (e.g., historical memory sensitivity), the prediction logic 406 predicts a memory demand 408 (predicted demand 408), such as for a subsequent or future time window. In aspects, the predicted demand 408 includes a bandwidth demand 510 and a latency demand 512 for a future point in time (e.g., a subsequent time window). Here, demand predictor 404 predicts, for the temperature-controlled memory domain, the bandwidth demand 510 as a predicted MPKI 514 and predicts the latency demand 512 as a predicted number of stall cycles 516.

Figure 6:
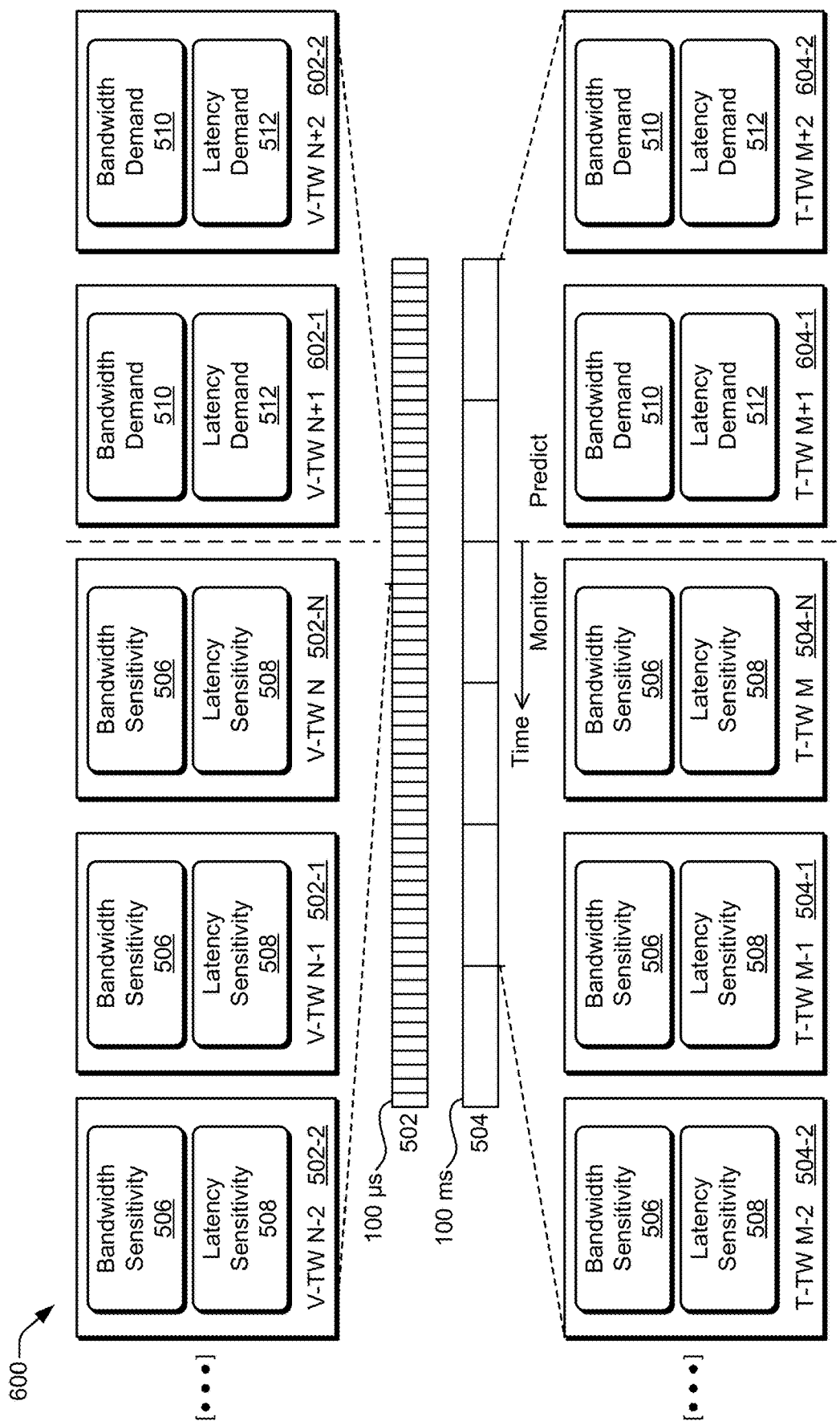
FIG. 6 illustrates an example of voltage time intervals and temperature time intervals of the memory demand predictor.

By way of example, consider FIG. 6 in which example series of voltage time windows 502 and temperature time windows 504 are illustrated at 600. Generally, the adaptive controller 106 can transition voltage of a temperature-controlled memory domain faster than temperature of the temperature-controlled memory domain. Accordingly, the demand predictor 404 may configure the voltage time windows 502 with a duration that is shorter than a duration of the temperature time windows 504. In some cases, the adaptive controller 106 calibrates a respective duration of the voltage time window or temperature time window by altering a voltage setting or temperature setting of the temperature-controlled memory domain. The adaptive controller 106 then monitors a length of time for the operating condition of the temperature-controlled memory domain to reach the altered voltage setting or temperature setting. Based on the length of time, the adaptive controller 106 configures a length of a time window for controlling the operational parameter of the temperature-controlled memory domain.

A length of a time window may correspond to a rate of change for controlling an operational parameter (e.g., voltage or temperature) of the temperature-controlled memory domain to affect performance (e.g., latency or bandwidth) of the memory domain. For example, a rate of change for voltage control by the adaptive controller 106 may be set with a voltage ramp up/down time (e.g., per±10 ns of memory latency) of 100 microseconds (μs). A rate of change for temperature control by the adaptive controller 106 may be set with a temperature ramp up/down time (e.g., per±10 ns of memory latency) of 100 milliseconds (ms). With reference to FIG. 6, the time windows are set with similar values, with the voltage time windows 502 having a length of 100 μs and the temperature time windows 504 having a length of 100 ms, though the adaptive controller 106 may set the respective time window lengths to any suitable value. Alternatively or additionally, the adaptive controller 106 may adjust a ratio of the respective lengths of the voltage time windows 502 and temperature time windows 504 to implement different types of control profiles (e.g., performance or energy-conserving profiles).

In aspects, the memory performance monitor 212 records, during each time window, bandwidth sensitivity 506 and/or latency sensitivity 508 a temperature-controlled memory domain. In some cases, the memory performance monitor 212 records bandwidth sensitivity 506 and/or latency sensitivity 508 for multiple temperature-controlled memory domains of the memory system 112. As shown in FIG. 6, the memory performance monitor 212 records bandwidth sensitivity 506 and latency sensitivity 508 for previous and/or current voltage time windows that include voltage time windows (V-TW) N-2 502-2, voltage time window N-1 502-1, and voltage time window N 502-N. The memory performance monitor 212 also records bandwidth sensitivity 506 and latency sensitivity 508 for previous and/or current temperature time windows that include temperature time windows (T-TW) N-2 504-2, temperature time window N-1 504-1, and temperature time window N 504-N. Here, note that with time windows of different length, the adaptive controller 106 may implement concurrent and independent mechanisms to monitor, predict, and control the voltage and the temperature of the temperature-controlled memory domain.

Based on the recorded bandwidth sensitivity 506 and/or latency sensitivity 508 for the voltage time windows and temperature time windows, the demand predictor 404 can predict memory demand 408 for a subsequent voltage time window and temperature time window. In aspects, the prediction logic 406 of the demand predictor is configured to predict memory demand for a future point in time based on machine learning, a moving average calculation, or a Markov prediction circuit. A moving average calculation may generate a predicted memory demand based on an assumption that memory demand of a subsequent time window will be similar to previous time windows. A Markov prediction circuit can predict an amount of memory demand most commonly observed after the current time window or interval N (e.g., for a next time window (N+1)). The demand predictor 404 may then invoke the Markov prediction circuit again to predict the most likely value occurring after the time window for which the first prediction is made (e.g., time window N+2 interval).

In the context of FIG. 6, the demand predictor 404 predicts, based on the recorded bandwidth sensitivity 506 and/or latency sensitivity 508 for the voltage time windows and temperature time windows, the predicted demand 408 for the next two time windows. Here, the demand predictor 404 invokes the Markov prediction circuit twice to predict bandwidth demand 510 and latency demand 512 for the next voltage time windows that include voltage time windows N+1 602-1 and voltage time window N+2 602-2. The demand predictor 404 also predicts bandwidth demand 510 and latency demand 512 for the next temperature time windows that include temperature time window N+1 604-1 and temperature time window N+2 604-2. As described with reference to FIG. 5, the predicted bandwidth demand 510 and latency demand 512 may indicate a predicted MPKI 514 and predicted stall cycles 516 for a temperature-controlled memory domain.

Returning to FIG. 5, the predicted demand 408 generated by the demand predictor is provided to the adaptive control logic 402 of the adaptive controller 106. Generally, the adaptive control logic 402 uses the predicted demand 408, such as the predicted MPKI 514 or predicted stall cycles 516, to determine whether to alter respective operational parameters of the temperature-controlled memory domains to affect performance of the memory domains. In various implementations, the adaptive control logic 402 includes thresholds 518 to which the predicted demand 408 can be compared to determine whether or how to alter the respective operational parameters of the temperature-controlled memory domain. Based on at least the predicted demand 408, the adaptive control logic 402 provides cryogenic memory settings 520 that the adaptive controller 106 can apply to a temperature-controlled memory domain to affect performance of the memory domain. Examples of the cryogenic memory settings 520, for a cryogenic memory 114, include a temperature 306, a voltage 308, a frequency 522, or an ECC level 524. Other examples of the thresholds 518 and cryogenic memory settings are described herein.

Figure 7:
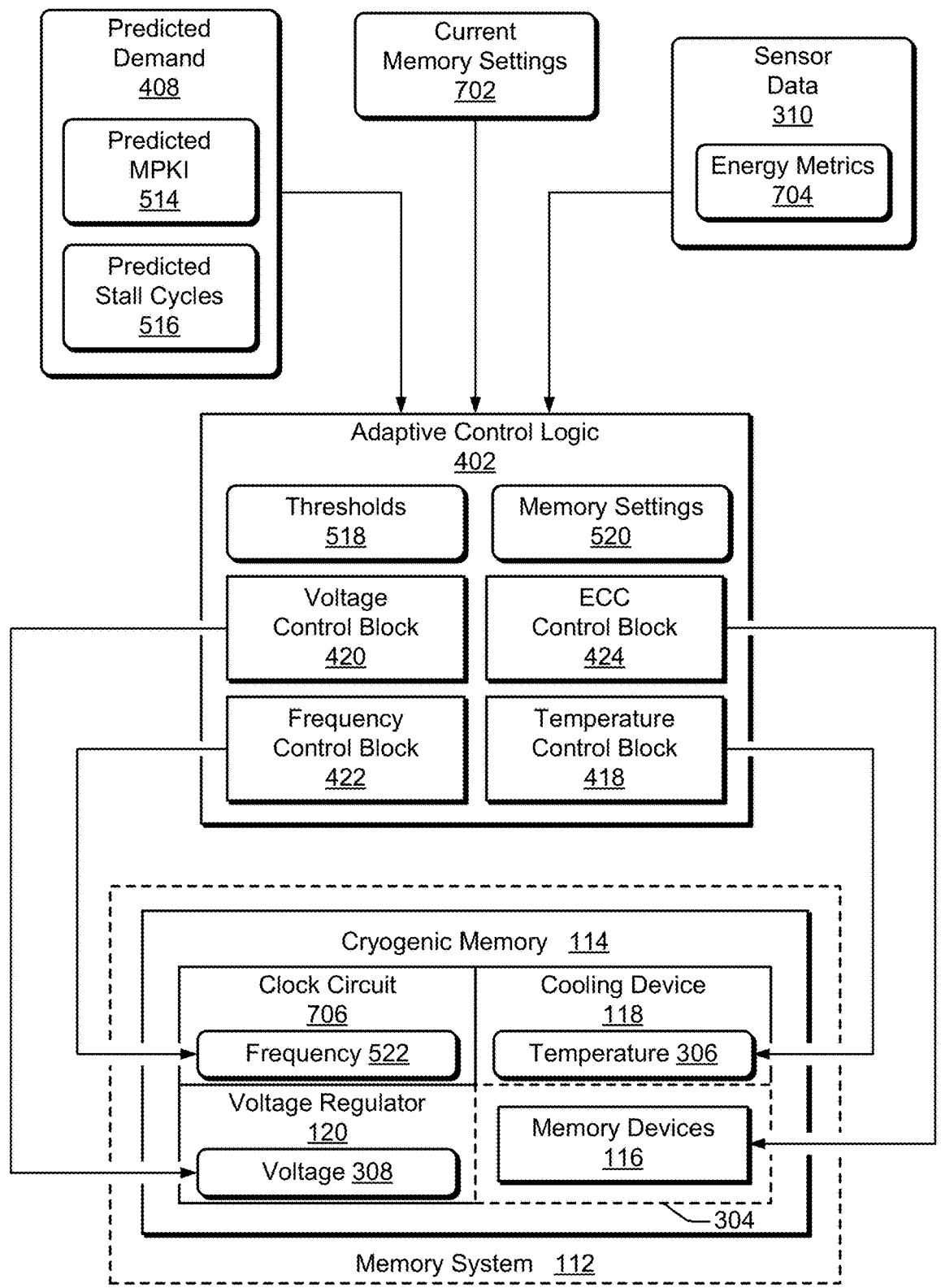
FIG. 7 illustrates an example configuration of adaptive control logic that alters settings of a temperature-controlled memory domain in accordance with one or more aspects.

FIG. 7. illustrates at 700 an example configuration of adaptive control logic that is coupled to a temperature-controlled memory domain. The adaptive control logic 402 may be coupled to any suitable number of cryogenic memories 114 of a memory system 112. Accordingly, the adaptive controller 106 may monitor and control multiple cryogenic memories 114 of the memory system 112 to implement an adaptive memory system. In aspects, the adaptive controller 106 uses the control logic 402 to alter settings of a temperature-controlled memory domain based on predicted memory demand for the temperature-controlled memory domain, which may be effective to tailor performance of the memory domain to changes in memory demand of programs executing on the host 102.

In this example, the adaptive control logic 402 is coupled to the cryogenic memory 114, which may be configured similar to or differently from other instances of cryogenic memory described herein. The adaptive control logic 402 is implemented as part of the adaptive controller 106 (not shown), and is also able to access the predicted demand 408 of the demand predictor 404, current cryogenic memory settings 702, and/or sensor data 310. Here, the predicted demand 408 includes the predicted MPKI 514 and predicted stall cycles 516 (e.g., for a time window) and the sensor data 310 includes energy metrics 704 that describe energy consumption of the cooling device 118 and voltage regulator 120 of the cryogenic memory 114. The current cryogenic memory settings 702 may include settings information of the memory system 112, such as previously configured voltage, frequency, ECC, or temperature settings.

In aspects, the adaptive control logic 402 uses the predicted demand 408, such as the predicted MPKI 514 or predicted stall cycles 516, to determine whether to alter respective operational parameters, such as voltage or temperature, of the temperature-controlled memory domains to affect performance of the memory domains. For example, in response to predicted demand that exceeds current memory performance, the adaptive controller can reduce temperature or increase voltage of the temperature-controlled memory domain to increase memory bandwidth or reduce memory latency. Alternatively, when predicted demand is below current memory performance, the adaptive controller can increase temperature of the temperature-controlled memory domain to reduce energy consumed by a cooling device or voltage regulator of the temperature-controlled memory domain.

As noted, the adaptive controller can transition a voltage of a temperature-controlled memory domain faster than a transition of temperature. Thus, in some implementations, the adaptive controller addresses short-term or quick changes in memory demand by altering the voltage 308 of the voltage regulator 120 and addresses longer-term or slow changes in memory demand by altering the temperature 306 of the cooling device 118. Further, because multiple aspects of memory performance, such as latency and bandwidth, are affected similarly by the control mechanisms of the operational parameters (e.g., voltage and temperature), the control mechanisms of the adaptive controller do not have to be decoupled (e.g., may operate concurrently on voltage and temperature). In some cases, the adaptive controller may also adjust an ECC level or ECC tier applied to the data of the temperature-controlled memory domain. For example, when the adaptive controller lowers a voltage or increases a temperature of the memory domain, a memory error rate of the domain may increase. Before entering a less reliable voltage and frequency combination, the adaptive controller may increase ECC strength of the data by using a stronger ECC scheme or enabling a higher tier (e.g., second tier) of ECC encoding.

In aspects, the adaptive control logic 402 compares the predicted demand with the thresholds 518 to determine which operational parameters of the temperature-controlled memory domain to alter or adjust. In some cases, the adaptive control logic 402 may also use or compare the energy metrics 704 for a cooling device 118 and voltage regulator 120 of the temperature-controlled memory domain to weigh energy considerations when determining which operational parameters to adjust. Accordingly, the adaptive control logic 402 can compare the predicted MPKI 514 and/or the predicted stall cycles 516 to multiple thresholds 518 to determine or provide the cryogenic memory settings 520 for controlling the operational parameters of the cryogenic memory 114. The cryogenic memory settings 520 for the operational parameters may include values, increments, or decrements of one or more of a temperature 306, a voltage 308, a frequency 522, an ECC level 524, or the like. In some cases, the adaptive control logic 402 determines a cryogenic memory setting 520 by incrementing or decrementing a current cryogenic memory setting 702 or a measurement of a parameter provided by the sensors 302.

By way of example, consider a control algorithm that the adaptive control logic 402 may implement to control voltage or temperature of a cryogenic memory 114. Here, the control algorithm may use predicted demand from the voltage time windows or temperature time windows.

If (predicted MPKI>BW threshold OR predicted stall cycles>latency threshold)
        If (rate of increase>rate of increase threshold)
            increase voltage
        Else
            decrease temperature
    Else (memory operating with at acceptable performance)
        If (current temperature<=maximum temperature)
            Increase temperature
        Else
            Decrease voltage Example Control Algorithm In the example control algorithm, the bandwidth threshold (BW threshold) can be set to a maximum allowed MPKI, which indicates insufficient bandwidth and the latency threshold can be set to a maximum allowed stall cycles per interval due to memory latency. Additionally, the rate of increase threshold may be useful to balance adjustments related to short-term and long-term changes in memory demand. In some cases, the rate of change is configured based on a transition time of a voltage adjustment or a temperature adjustment of the temperature-controlled memory domain. Accordingly, the control algorithm may be configurable based on minimum levels of memory performance (e.g., bandwidth or latency) or power savings, such as by increasing the rate of increase threshold to avoid voltage increases that typically consume more energy than temperature decreases.

To apply the cryogenic memory settings 520, the adaptive control logic 402 may use one or more of the temperature control block 418, voltage control block 420, frequency control block 422, and ECC control block 424 to alter or adjust a respective setting of the cryogenic memory 114. Here, each of the control blocks is coupled to a respective one of a cooling device 118, voltage regulator 120, clock circuit 706, and ECC settings register (not shown) of the cryogenic memory 114. In aspects, the adaptive control logic 402 may alter or revise the settings of the cryogenic memory 114 before or during the subsequent time window. By so doing, the adaptive control logic 402 may increase performance of the memory domain before the predicted increase in memory demand occurs, thereby reducing a potential impact of program performance due to a lack bandwidth or excess latency of the cryogenic memory. Other examples of control operations are described herein, such as with reference to the methods of FIGS. 10-15.

Figure 8:
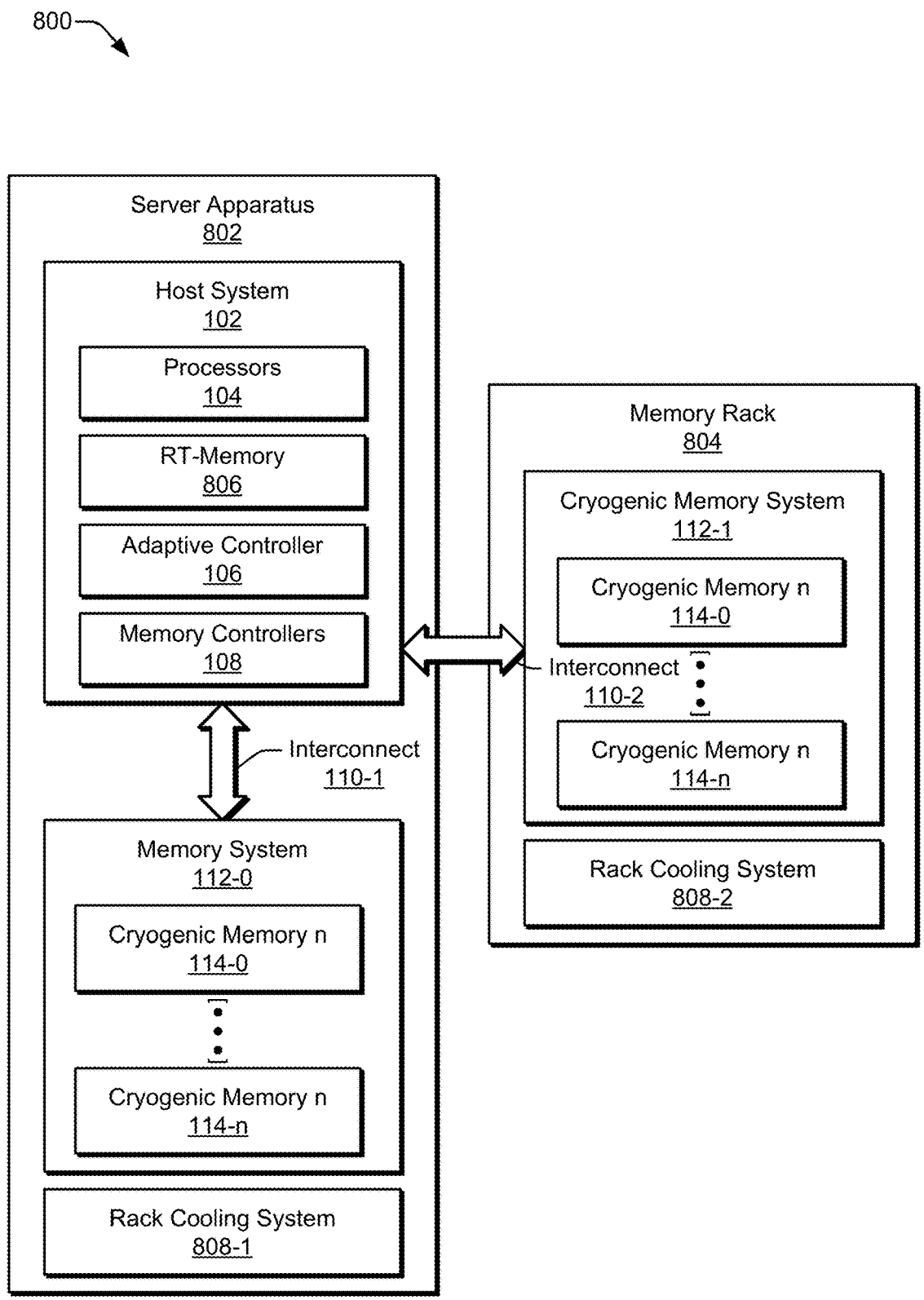
FIG. 8 illustrates an example server apparatus in which aspects of an adaptive memory system can be implemented.
Figure 9:
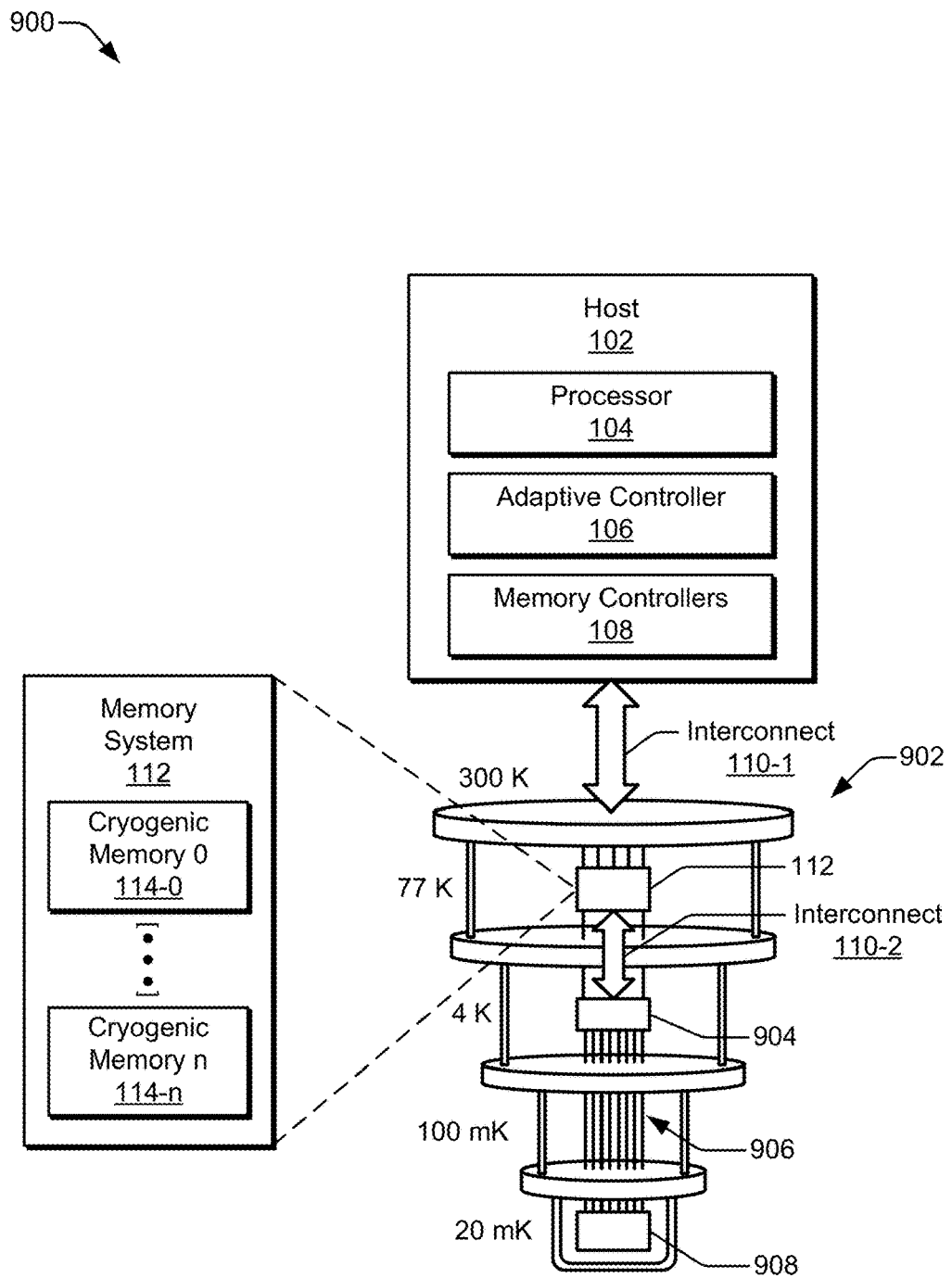
FIG. 9 illustrates an example quantum computing apparatus in which aspects of an adaptive memory system can be implemented.

Aspects of a memory system can be implemented in any suitable apparatus, such as apparatus 100 of FIG. 1. As other examples, FIGS. 8 and 9 illustrate example configurations of a server apparatus and a quantum computing apparatus, respectively. The example apparatuses of FIG. 1, 8, or 9 may be implemented similar to or differently from each other, in any suitable combination, or with fewer, additional, or different components that those shown or described.

FIG. 8 illustrates at 800 an example server apparatus 802 that includes a host 102, or host system 102, and memory system 112-1 implemented in a memory rack 804 (e.g., a cryogenic memory rack). In this example, the host 102 of the server apparatus may be configured similar to the host 102 of apparatus 100 with processors 104, an adaptive controller 106, memory controllers 108, an interconnect 110, and a memory system 112-0. In addition to the memory system 112-0, the host 102 may also a room-temperature memory 806 (RT-memory 806) coupled with the processor 104. The RT-memory 806 may serve as part of a main memory of the host 102, which may direct memory operations to the RT-memory 806 or the memory system 112-0. Alternatively or additionally, the host 102 may also be coupled with the memory system 112-1 of the memory rack 804. In such cases, the host 102 may also direct memory operations to the memory system 112-1 of the memory rack 804.

The server apparatus 802 and the memory rack 804 may include or be coupled to a rack cooling system 808. Generally, the rack cooling systems 808-1 and 808-2 cools and provides temperature control for a memory system or the cryogenic memories 114. Thus, the adaptive controller 106 may be coupled with the rack cooling systems 808 to control temperatures of temperature-controlled memory domains of the memory system of the server apparatus or the memory rack.

In aspects, a server group or server cluster may be implemented with memory systems, either co-located with a host 102 in a server apparatus 802 (e.g., server rack) or housed in separate memory racks 804. By way of review, cryogenic memory or memory operated at cryogenic temperatures (e.g., below 100 K) consumes much less energy than room-temperature memory (e.g., RT-memory 806). This reduction in memory energy use translates into cost savings, which are typically much greater than costs associated with operating the rack cooling systems 808 or other server cooling systems. Accordingly, a server cluster implemented with one or more memory systems 112 may cost less to operate than a room temperature server cluster.

These cost savings can be further increased by using an adaptive memory system in which the adaptive controller 106 manages the operational parameters of the memory systems 112 of the server apparatus or memory racks. In contrast with operating the memory systems 112 with constant temperature or voltage settings, the adaptive controller 106 can alter the temperature or voltage settings based on monitored or predicted memory demand. For example, when performance of a cryogenic memory 114 is in excess of an acceptable level, the adaptive controller 106 may reduce voltage or increase temperature of the cryogenic memory to save additional energy and cost until a subsequent change (e.g., predicted increase in bandwidth or latency demand) in memory performance. By scaling the energy and cost advantages provided by the adaptive memory system across server groups or data centers, the described aspects may reduce data center energy costs by approximately ten to twenty percent.

FIG. 9 illustrates at 900 an example quantum computing apparatus 902 that includes a host 102 and memory system 112 implemented as part of the quantum computing apparatus. The quantum computing apparatus 902 may be implemented similar to or different from the quantum computing system 100-5 of FIG. 1, and may include more, fewer, or different components. The components of the quantum computing apparatus 902 operate at different respective temperatures, examples of which are shown in FIG. 9.

In this example, the host 102 of the quantum computing apparatus 902 is configured similar to the host 102 of apparatus 100 with a processor 104, an adaptive controller 106, memory controllers 108, and an interconnect 110-1. Here, a memory system 112 of the quantum computing apparatus 902 is coupled to the host 102 via a first interconnect 110-1 and to a control processor 904 of the quantum computing apparatus via a second interconnect 110-2. In some implementations, the memory system 112 serves a memory for the control processor 904 of the quantum computing apparatus 902. As such, the memory system 112 and cryogenic memories 114 (e.g., temperature-controlled memory domains) can be implemented as a dual port memory providing access to both the host 102 and the control processor 904. The control processor 904 (e.g., Josephson junction logic) is coupled by a control interface 906 (e.g., high density superconducting wires) to a quantum substrate 908 (e.g., superconducting Qubits) of the quantum computing apparatus. In some implementations, the control processor 904 includes a quantum execution unit through which quantum processing of the quantum substrate 908 is implemented. The control processor 904 may include performance counters that indicate respective memory performance metrics of the temperature-controlled memory domains of the memory system 112. Further, the control processor 904 or the second interconnect 110-2 may also expose address information useful by an adaptive controller 106 to implement aspects described herein.

Generally, the host 102 may provide, directly or indirectly through the control processor 904, various functionalities of the quantum computing apparatus, such as control, pre-processing and post-processing functions. In aspects, the host 102 stores, via the interconnect 110-1, data of software or applications executing on the host 102 to the memory system 112 for quantum processing. The control processor 904 can then access, via the interconnect 110-2, the data of the memory system 112 and cause the quantum substrate 908 to process the data. During quantum processing or on completion, the control processor 904 can store the data or resultant data set to the memory system 112. In aspects, the adaptive controller 106 may obtain memory performance metrics and/or address information from the host 102 or the control processor 904. Alternatively or additionally, the adaptive controller 106 may also monitor memory transactions over either of the interconnects 110-1 or 110-2 and control operational parameters of the memory system as described herein. To enable such aspects, an instance of the adaptive controller 106 may be implemented in association with the control processor 904 of the quantum computing apparatus 902.

Example Methods for Adaptive Memory

Figure 10:
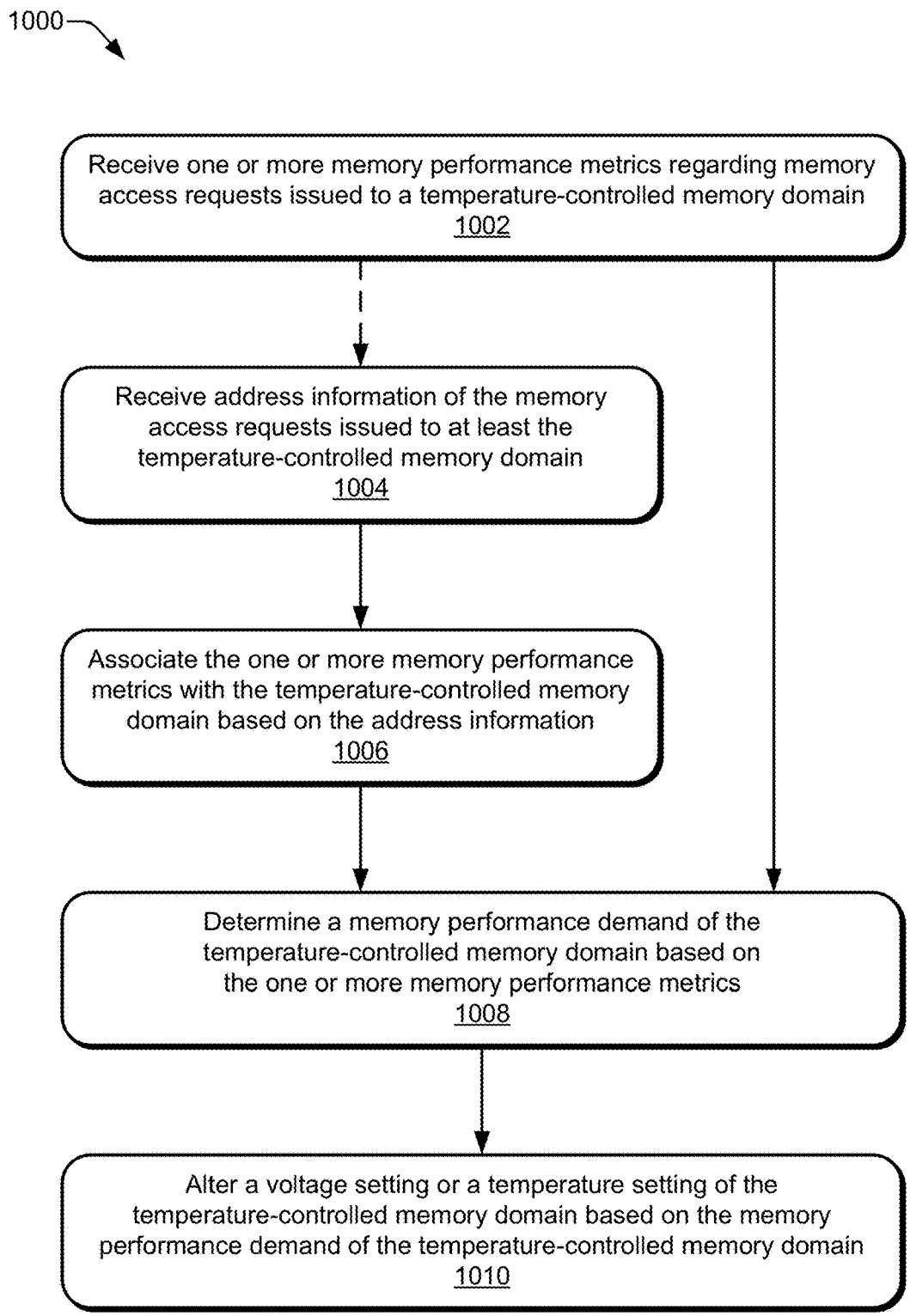
FIG. 10 depicts an example method for altering a voltage setting or a temperature setting of a temperature-controlled memory domain in accordance with one or more aspects.

Example methods are described in this section with reference to the flow charts and flow diagrams of FIGS. 10-15. These descriptions reference components, entities, and other aspects depicted in FIGS. 1-9 by way of example only. FIG. 10 depicts a flow diagram 1000 of an example method for altering a voltage setting or a temperature setting of a temperature-controlled memory domain. The flow diagram 1000 includes operations 1002 through 1010, which an adaptive controller 106 may perform to implement aspects of adaptive memory as described herein.

At 1002, the adaptive controller receives memory performance metrics of a temperature-controlled memory domain. For example, the adaptive controller can receive, from a host processor, an indication a number of cycles for which memory read instructions associated with the temperature-controlled memory domain stall in a reorder buffer or an MPKI rate for the memory read instructions associated with the temperature-controlled memory domain. The temperature-controlled memory domain may correspond to a cryogenic memory of a memory system associated with the host processor.

Optionally at 1004, the adaptive controller receives address information of memory requests made to at least the temperature-controlled memory domain. In some cases, the adaptive controller monitors memory requests issued over an interconnect disposed between the processor and the temperature-controlled memory domain. At 1006, the adaptive controller associates corresponding ones of the memory performance metrics with the temperature-controlled memory domain based on the address information. In some cases, the adaptive controller determines which memory performance metrics correspond to the temperature-controlled memory domain based on addresses of the memory requests issued by the host or memory controller.

At 1008, the adaptive controller predicts memory performance demand for the temperature-controlled memory domain based on the memory performance metrics. The adaptive controller may use any suitable prediction logic or circuit, such as machine learning, a moving average algorithm, or a Markov prediction circuit to predict the memory performance demand for the temperature-controlled memory domain. In some cases, the predicted memory performance demand is a predicted number of stall cycles or MPKI of a processor that are expected to occur over a future duration of time.

At 1010, the adaptive controller alters a voltage setting or a temperature setting of the temperature-controlled memory domain based on the memory performance demand predicted for the temperature-controlled memory domain. Alternatively or additionally, the adaptive controller may alter a frequency setting (e.g., to increase bandwidth) or an ECC setting of the temperature-controlled memory domain based on the predicted memory performance demand. In some cases, the adaptive controller increases the voltage setting or decreases the temperature setting in response to determining that the predicted memory demand exceeds a performance threshold of the temperature-controlled memory domain. In other cases, the adaptive controller decreases the voltage setting or increases the temperature setting in response to determining that the predicted memory demand does not exceed the performance threshold of the temperature-controlled memory domain.

Figure 11:
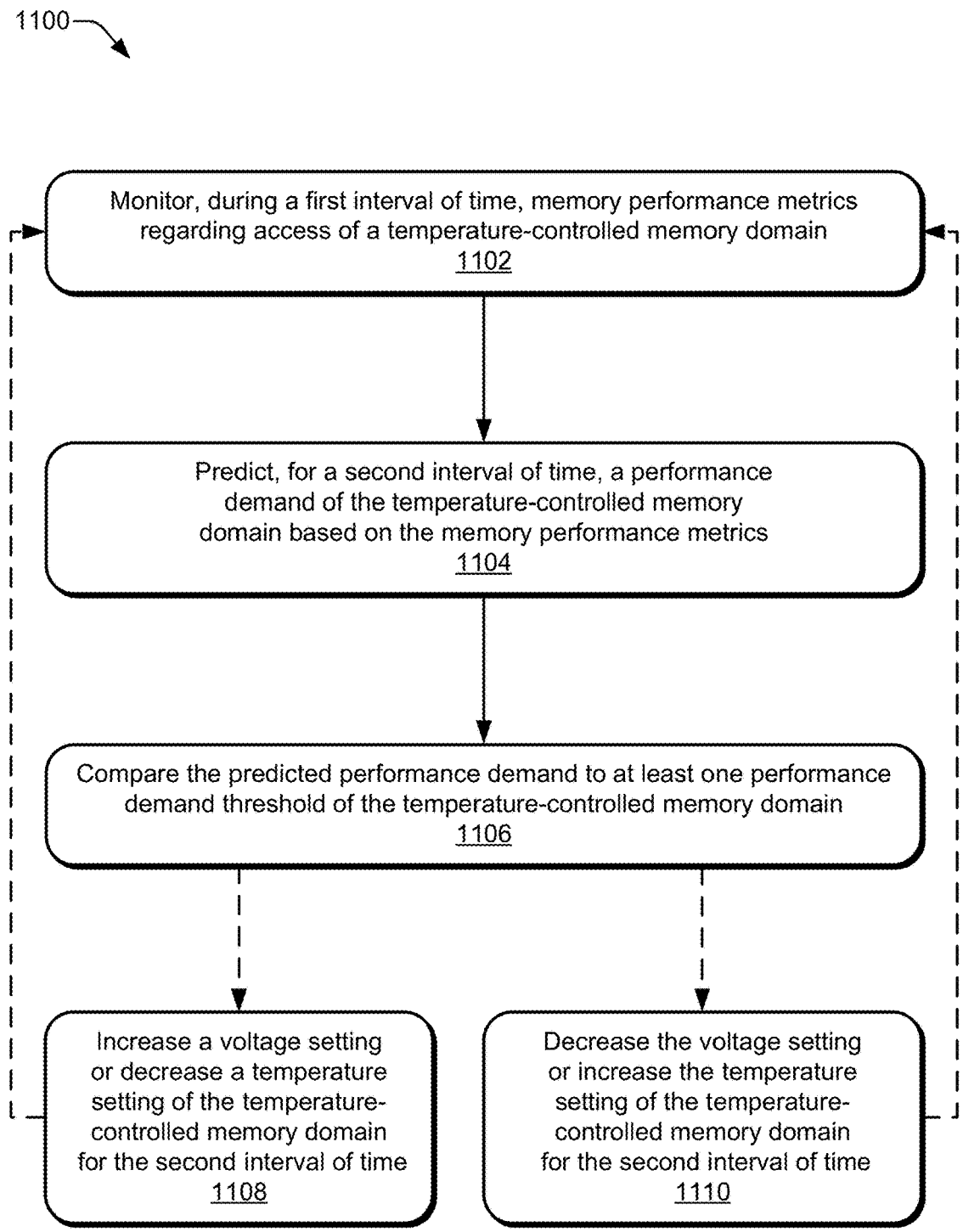
FIG. 11 depicts an example method for altering a setting of a temperature-controlled memory domain based on memory performance metrics of previous memory accesses.

FIG. 11 depicts a flow diagram 1100 of an example method for altering a setting of a temperature-controlled memory domain based on memory performance metrics of previous access. The flow diagram 1100 includes operations 1102 through 1110, which an adaptive controller 106 may perform to implement aspects of adaptive memory as described herein.

At 1102, the adaptive controller monitors, during a first time interval, memory performance metrics of a temperature-controlled memory domain. The adaptive controller may monitor performance counters of a host processor to obtain the memory performance metrics of the temperature-controlled memory domain. In some cases, the adaptive controller uses address information of memory requests issued by the host processor to resolve which performance metrics correlate to the memory requests sent to the temperature-controlled memory domain. The time interval may include a time interval configured for controlling a voltage or a temperature of the temperature-controlled memory domain, which may correspond to a respective time for transitioning a voltage or a temperature of the temperature-controlled memory domain to another setting (e.g., minimum increment or decrement amount).

At 1104, the adaptive controller predicts, for a second time interval, performance demand for the temperature-controlled memory domain based on the memory performance metrics. The adaptive controller may use any suitable prediction logic or methodology, such as machine learning, a moving average algorithm, or a Markov prediction circuit to predict the memory performance demand for the temperature-controlled memory domain. In some cases, the predicted memory performance demand is a predicted number of stall cycles or MPKI of a processor that are expected to occur during the second time interval. Alternatively or additionally, the adaptive controller may obtain information or sensor data from the temperature-controlled memory domain that indicates current operational conditions or energy usage by the temperature-controlled memory domain.

At 1106, the adaptive controller compares the predicted performance demand to at least one performance demand threshold for the temperature-controlled memory domain. The performance demand threshold may include a rate of change threshold for memory demand, a minimum bandwidth threshold, a maximum latency threshold, a maximum temperature threshold, a cooling energy threshold, a memory energy threshold, or the like.

Optionally at 1108, the adaptive controller increases a voltage setting or decreases a temperature setting of the temperature-controlled memory domain for the second interval of time based on the comparison of operation 1106. For example, if the predicted demand exceeds one of the performance demand thresholds (e.g., for a rate of change or MPKI), the adaptive controller increases the voltage setting and/or decreases the temperature setting of the temperature-controlled memory domain to increase performance of the memory domain. The adaptive controller may alter the voltage setting or the temperature setting before or during the second time interval to affect the performance (e.g., latency or bandwidth) of the temperature-controlled memory domain. From operation 1108, the method 1100 may return to operation 1102 to implement another iteration of altering a setting of the temperature-controlled memory domain based on memory performance metrics.

Optionally at 1110, the adaptive controller decreases the voltage setting or increases the temperature setting of the temperature-controlled memory domain for the second interval of time based on the comparison of operation 1106. For example, if the predicted demand does not exceed one of the performance demand thresholds (e.g., for performance, temperature, or energy consumption), the adaptive controller decreases the voltage setting and/or increases the temperature setting of the temperature-controlled memory domain to reduce energy consumption of the memory domain. The adaptive controller may alter the voltage setting or the temperature setting before or during the second time interval to affect the energy consumption of the temperature-controlled memory domain. From operation 1110, the method 1100 may return to operation 1102 to implement another iteration of altering a setting of the temperature-controlled memory domain based on memory performance metrics.

Figure 12:
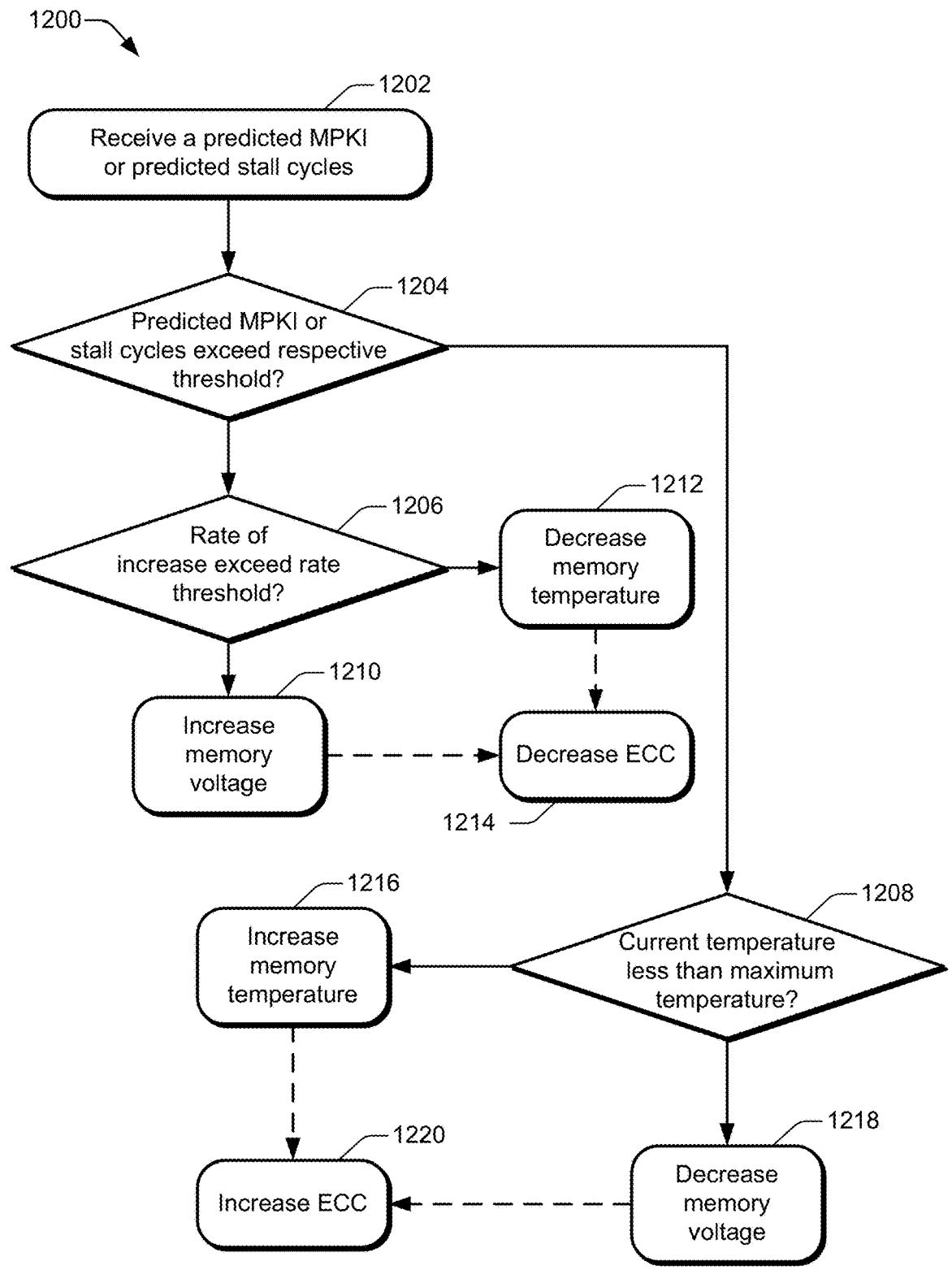
FIG. 12 depicts a flow chart of example methods that an adaptive controller can implement for a temperature-controlled memory domain based on predicted memory demand.

FIG. 12 depicts a flow chart 1200 of example method(s) for adaptive memory control based on predicted memory demand. The flow chart 1200 includes operations 1202 through 1220, which adaptive control logic 402 may implement in accordance with aspects of adaptive memory.

At 1202, the adaptive control logic receives a predicted MPKI value or predicted number of stall cycles value. The predicted MPKI or predicted stall cycle value may be received from a demand predictor of an adaptive controller. At 1204, the adaptive control logic compares the predicted MPKI value or the predicted stall cycles value to a MPKI threshold or a stall cycle threshold, respectively. A maximum MPKI threshold may be configured to indicate insufficient bandwidth available to software executing on a host. A minimum latency threshold may be configured to indicate excessive latency with respect to memory access by the software executing on the host.

From operation 1204, the adaptive control logic proceeds to operation 1206 if the predicted MPKI value exceeds the MPKI threshold or the predicted stall cycles value exceeds the stall cycle threshold. Alternatively, the adaptive control logic proceeds to operation 1208 if the predicted MPKI value does not exceed the MPKI threshold or the predicted stall cycles value does not exceed the stall cycles threshold.

At 1206, the adaptive control logic compares a rate of increase of the predicted MPKI value or a rate of increase of the predicted stall cycle value with a rate threshold for MPKI or a rate threshold for stall cycles. From operation 1206, the adaptive control logic proceeds to operation 1210 if the rate of increase of the predicted MPKI value exceeds the rate threshold for MPKI increase or the rate increase of the predicted stall cycle value exceeds the rate threshold for stall cycles. Alternatively, the adaptive control logic proceeds to operation 1212 if the rate of increase of the predicted MPKI value does not exceed the rate threshold for MPKI increase or the rate increase of the predicted stall cycle value does not exceed the rate threshold for stall cycles.

At 1210, the adaptive control logic increases a voltage of the temperature-controlled memory domain. In some cases, a rate of increase for the predicted demand that exceeds the rate of increase threshold indicates a short-term change in memory demand, which can be addressed by increasing the voltage of the temperature-controlled memory domain. Increasing the voltage may allow the adaptive controller to increase an operating frequency of the temperature-controlled memory domain, which can increase bandwidth and/or decrease latency of the memory domain.

At 1212, the adaptive control logic decreases a temperature of the temperature-controlled memory domain. In some cases, a rate of increase for the predicted demand that does not exceed the rate of increase threshold indicates a long-term change in memory demand, which can be addressed by decreasing the temperature of the temperature-controlled memory domain. Decreasing the temperature may decrease the latency of the memory domain and/or enable the adaptive controller to increase an operating frequency to increase bandwidth of the memory domain. From operation 1210 or operation 1212, the adaptive control logic may return to operation 1202 to implement another iteration of the operations of the flow chart 1200.

Alternatively, from operation 1210 or operation 1212, the adaptive control logic may proceed to operation 1214 to decrease an error-correcting code scheme or tier applied to the temperature-controlled memory domain. When entering a scenario of increased voltage or decreased temperature, memory error rates of the temperature-controlled memory domain may decrease. As such, the adaptive controller may decrease an ECC level or tier applied to data of the temperature-controlled memory domain to reduce encoding or decoding overhead and further improve memory performance. From operation 1214, the adaptive control logic may return to operation 1202 to implement another iteration of the operations of the flow chart 1200.

Returning to the alternate path of operations from operation 1204, the adaptive control logic proceeds to operation 1208 when the predicted MPKI value or the predicted stall cycles value does not exceed the respective threshold.

At 1208, the adaptive control logic compares a current temperature of the temperature-controlled memory domain to a maximum temperature threshold for the temperature-controlled memory domain. From operation 1208, the adaptive control logic proceeds to operation 1216 if the current temperature of the temperature-controlled memory domain does not exceed the temperature threshold for the temperature-controlled memory domain. Alternatively, the adaptive control logic proceeds to operation 1218 if the current temperature of the temperature-controlled memory domain exceeds the temperature threshold for the temperature-controlled memory domain.

At 1216, the adaptive control logic increases the temperature of the temperature-controlled memory domain. By increasing the temperature, the adaptive controller may reduce power energy consumption of a cooling device or cooling system of the temperature-controlled memory domain. At 1218, the adaptive control logic decreases the voltage of the temperature-controlled memory domain. When the temperature of the temperature-controlled memory domain is at a maximum allowed temperature, the adaptive controller may decrease the voltage of the memory as an alternate or additional way to reduce energy consumption of the temperature-controlled memory domain. From operation 1216 or operation 1218, the adaptive control logic may return to operation 1202 to implement another iteration of the operations of the flow chart 1200.

Alternatively, from operation 1216 or operation 1218, the adaptive control logic may proceed to operation 1220 to increase the ECC scheme or ECC tier applied to the temperature-controlled memory domain. When entering a scenario of decreased voltage or increased temperature, memory error rates of the temperature-controlled memory domain may increase (e.g., decreased memory performance). As such, the adaptive controller may increase the ECC level or ECC tier applied to the data of the temperature-controlled memory domain to reduce a memory error rate of the memory domain at the lower voltage or increased temperature. From operation 1220, the adaptive control logic may return to operation 1202 to implement another iteration of the operations of the flow chart 1200.

Figure 13A:
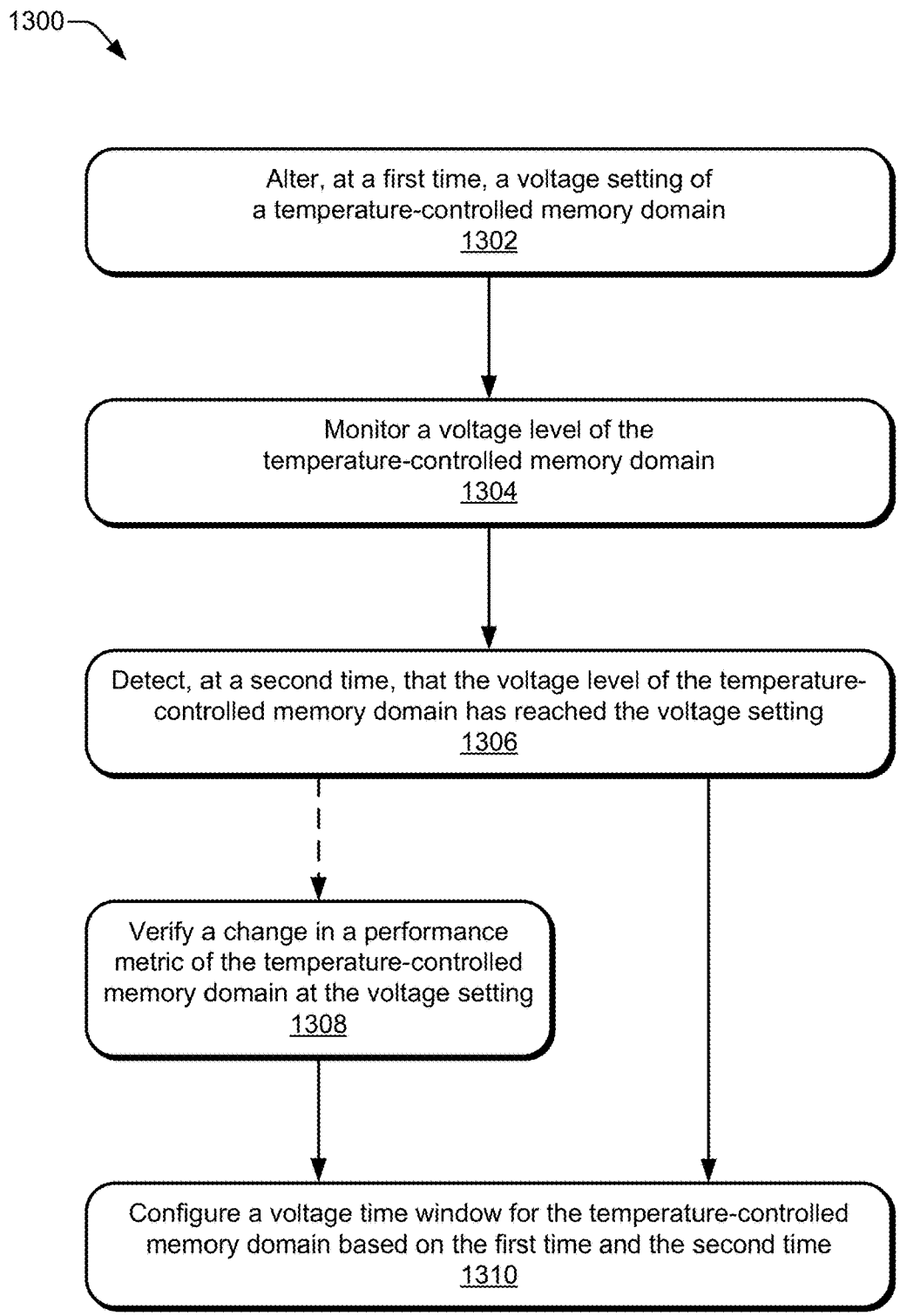
FIG. 13A depicts an example method for configuring a voltage time window for a temperature-controlled memory domain.

FIG. 13A depicts a flow diagram 1300 of an example method for configuring a voltage time interval of a temperature-controlled memory domain. The flow diagram 1300 includes operations 1302 through 1310, which an adaptive controller may perform to implement aspects of adaptive memory as described herein.

At 1302, the adaptive controller alters, at a first time, a voltage setting of the temperature-controlled memory domain. The adaptive controller may increment or decrement the voltage setting by a predefined or minimum amount. In other cases, the adaptive controller may increase or decrease the voltage setting based an amount of voltage useful to change a latency or bandwidth of the memory domain.

At 1304, the adaptive controller monitors a voltage level of the temperature-controlled memory domain. The adaptive controller may monitor a voltage regulator or sensor of the temperature-controlled memory domain to obtain an indication of the voltage level as the voltage level changes based on the voltage setting applied by the adaptive controller. At 1306, the adaptive controller detects, at a second time, that the voltage level of the temperature-controlled memory domain has reached the voltage setting.

Optionally at 1308, the adaptive controller verifies a change in a performance metric of the temperature-controlled memory domain at the voltage setting. In some cases, the adaptive controller verifies that the change in voltage corresponds to a change in bandwidth or latency for the memory domain. By so doing, the operations of method 1300 may also be used to determine or set an amount of voltage by which to increment or decrement the voltage setting to achieve a change in memory performance (e.g., bandwidth or latency).

At 1310, the adaptive controller configures the voltage time window for the temperature-controlled memory domain based on the first time and the second time. By so doing, the adaptive controller may configure a length or duration of the voltage time window, which can be used to monitor memory performance and predict memory demand of a memory system.

Figure 13B:
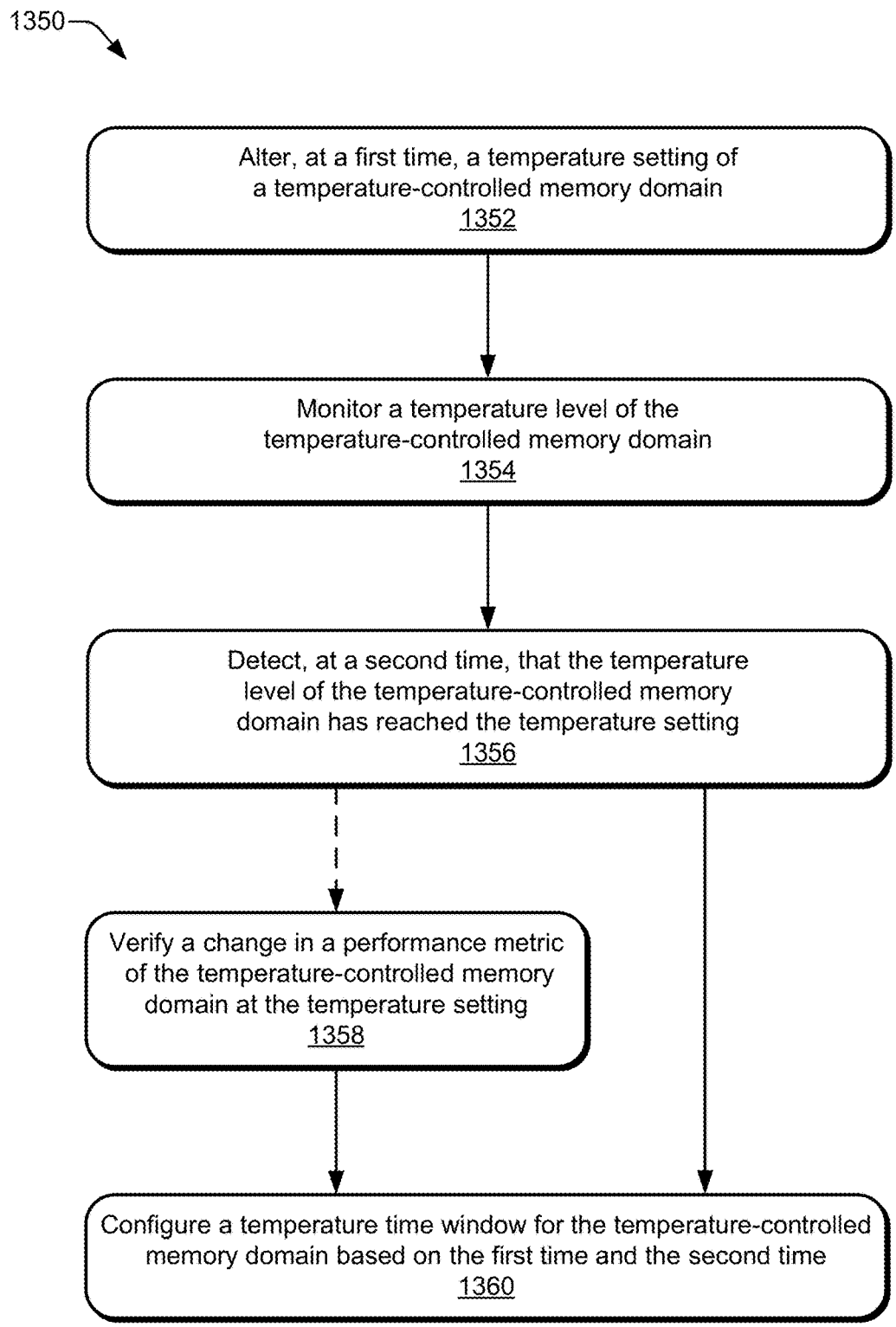
FIG. 13B depicts an example method for configuring a temperature time window for a temperature-controlled memory domain.

FIG. 13B depicts a flow diagram 1350 of an example method for configuring a temperature time interval for a temperature-controlled memory domain. The flow diagram 1350 includes operations 1352 through 1360, which an adaptive controller may perform to implement aspects of adaptive memory as described herein.

At 1352, the adaptive controller alters, at a first time, a temperature setting of the temperature-controlled memory domain. The adaptive controller may increment or decrement the temperature setting by a predefined or minimum amount. In other cases, the adaptive controller may increase or decrease the temperature setting based on a temperature shift that is useful to change a latency or bandwidth of the memory domain.

At 1354, the adaptive controller monitors a temperature level of the temperature-controlled memory domain. The adaptive controller may monitor a cooling device or sensor of the temperature-controlled memory domain to obtain an indication of the temperature level as the temperature changes based on the temperature setting applied by the adaptive controller. At 1356, the adaptive controller detects, at a second time, that the temperature level of the temperature-controlled memory domain has reached the temperature setting.

Optionally at 1358, the adaptive controller verifies a change in a performance metric of the temperature-controlled memory domain at the temperature setting. In some cases, the adaptive controller verifies that the change in temperature corresponds to a change in bandwidth or latency for the memory domain. By so doing, the operations of method 1350 may also be used to determine or set an amount of temperature by which to increment or decrement the temperature setting to achieve a change in memory performance (e.g., bandwidth or latency).

At 1360, the adaptive controller configures the temperature time window for the temperature-controlled memory domain based on the first time and the second time. By so doing, the adaptive controller may configure a length or duration of the temperature time window, which can be used to monitor memory performance and predict memory demand for a memory system.

Figure 14:
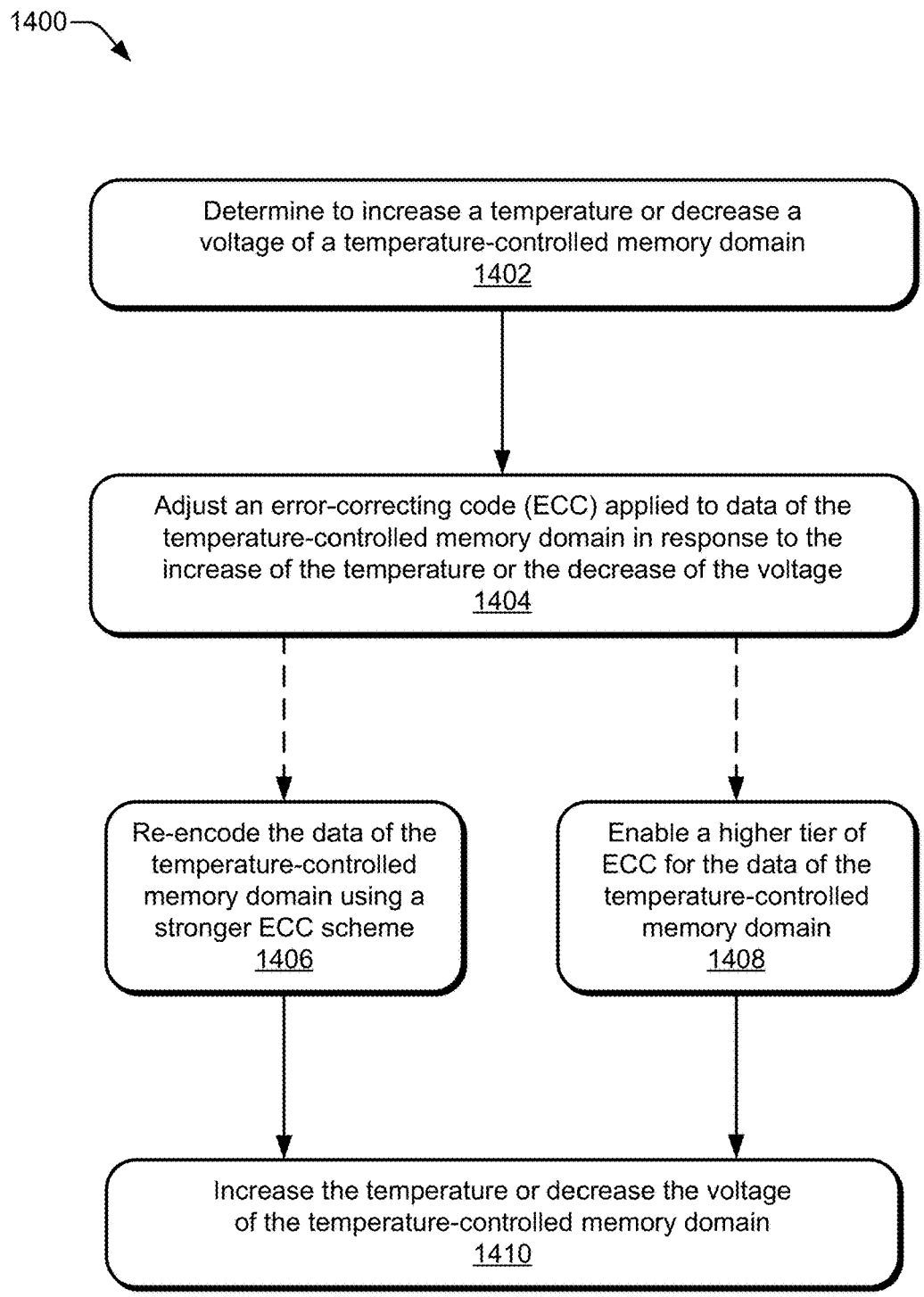
FIG. 14 depicts an example method for adjusting an error-correcting code setting of a temperature-controlled memory domain.

FIG. 14 depicts a flow diagram 1400 of an example method for adjusting an error-correcting code (ECC) setting of a temperature-controlled memory domain. The flow diagram 1400 includes operations 1402 through 1410, which an adaptive controller may perform to implement aspects of adaptive memory as described herein.

At 1402, the adaptive controller determines to increase a temperature or decrease a voltage of a temperature-controlled memory domain. For example, the adaptive controller may determine reduce energy consumption of the temperature-controlled memory domain by increasing the temperature or decreasing the voltage in response to determining that predicted memory demand for a future time interval or time window did not exceed a threshold.

At 1404, the adaptive controller adjusts an ECC applied to data of the temperature-controlled memory domain in response to the increase of the temperature or the decrease of the voltage. Optionally at 1406, the adaptive controller re-encodes the data of the temperature-controlled memory domain using a stronger ECC scheme. The adaptive controller may direct a host processor or ECC module of the temperature-controlled memory domain to read out the data, re-encode the data with the stronger ECC scheme, and write the data back to the temperature-controlled memory domain. Optionally at 1408, the adaptive controller enables a higher tier of ECC for the data of the temperature-controlled memory domain. For example, the adaptive controller may enables a higher tier of ECC encoding, such as a second or third level tier.

At 1410, the adaptive controller increases the temperature or decreases the voltage of the temperature-controlled memory domain. In other words, the adaptive controller may adjust the ECC applied to the data before the adaptive controller increases the temperature or decreases the voltage of the temperature-controlled memory domain. By so doing, the adaptive controller may prevent memory errors that can occur when the temperature-controlled memory domain begins operation with operating conditions that may result in less reliable operation.

Figure 15:
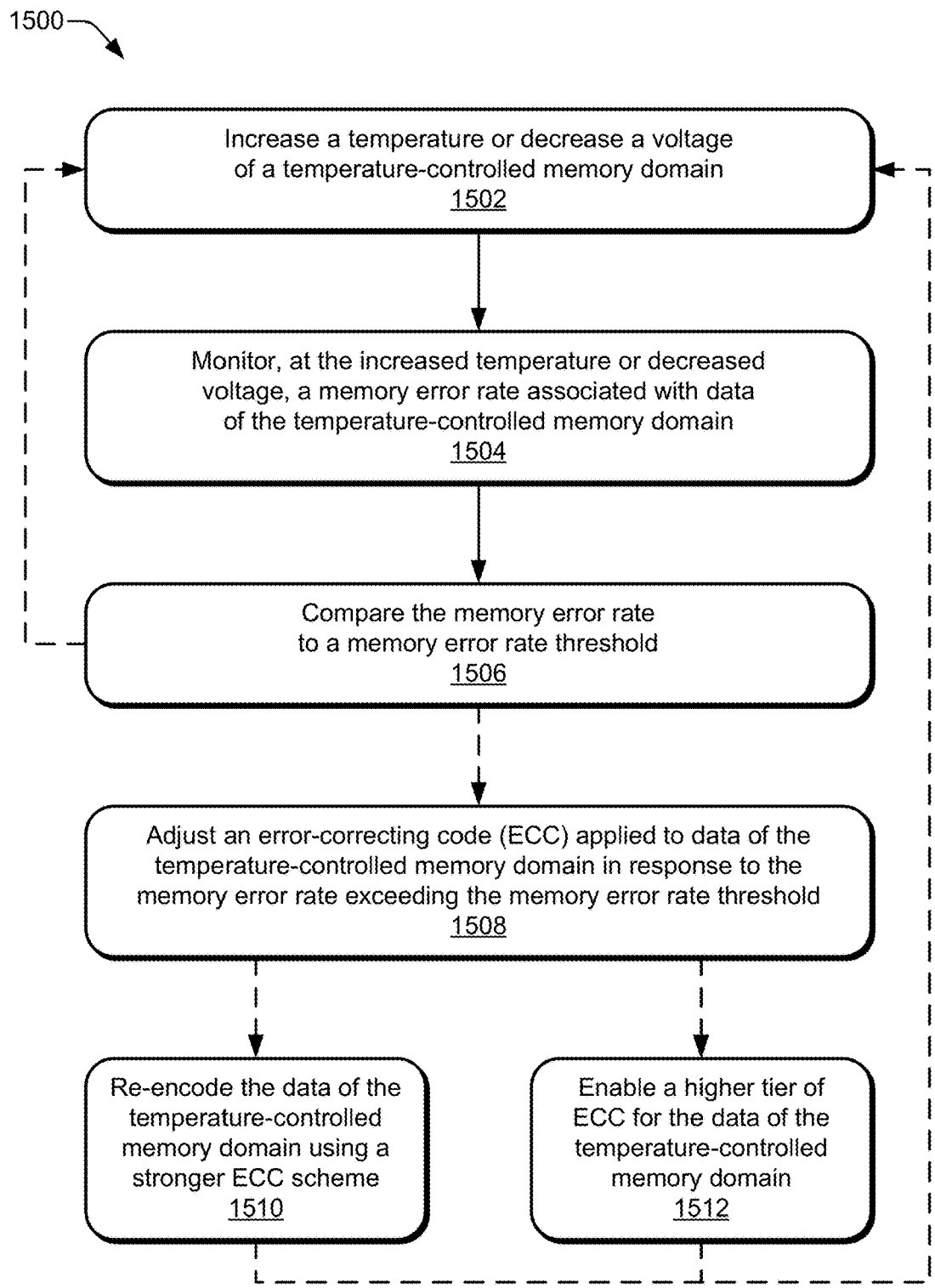
FIG. 15 depicts an example method for adjusting an error-correcting code of a temperature-controlled memory domain based on a memory error rate.

FIG. 15 depicts a flow diagram 1500 of an example method for adjusting an error-correcting code of a temperature-controlled memory domain based on a memory error rate. The flow diagram 1500 includes operations 1502 through 1512, which an adaptive controller may perform to implement aspects of adaptive memory.

At 1502, the adaptive controller increases a temperature or decreases a voltage of a temperature-controlled memory domain. The adaptive controller may increase the temperature or decrease the voltage to reduce an amount of energy consumed by a voltage regulator or cooling device of the temperature-controlled memory domain.

At 1504, the adaptive controller monitors, at the increased temperature or decreased voltage, a memory error rate associated with data of the temperature-controlled memory domain. In some cases, increasing the temperature or decreasing the voltage of the temperature-controlled memory domain increases a memory error rate for data written to or read from the memory domain by a host.

At 1506, the adaptive controller compares the memory error rate to a memory error rate threshold of the temperature-controlled memory domain. In some cases, the adaptive controller configures the memory error rate threshold based on an average or historical memory error rate associated with the memory domain. Alternatively or additionally the memory error rate threshold may be based on a memory error rate of the temperature-controlled memory domain that is measured before the change in temperature or voltage. From operation 1506, the adaptive controller may return to operation 1502 if the memory error rate of the data does not exceed the memory error rate threshold. Alternatively, the adaptive controller proceeds to operation 1508 if the memory error rate of the data does exceed the memory error rate threshold.

At 1508, the adaptive controller adjusts the ECC applied to the data of the temperature-controlled memory domain in response to the memory error rate exceeding the memory error rate threshold. Optionally at 1510, the adaptive controller may re-encode the data of the temperature-controlled memory domain using a stronger ECC scheme. Optionally at 1512, the adaptive controller enables a higher tier of ECC for the data of the temperature-controlled memory domain. From operation 1510 or operation 1512, the adaptive controller may return to operation 1502 to implement another iteration of the method 1500, such as when the adaptive controller further increases the temperature or decreases the voltage of the temperature-controlled memory domain.

For the flow charts and flow diagrams described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods or operations may be implemented in, for example, hardware (e.g., fixed-logic circuitry or a processor in conjunction with a memory), firmware, or some combination thereof. The methods may be realized using one or more of the apparatuses, systems, or components shown in FIGS. 1-9, the components of which may be further divided, combined, rearranged, and so on. The devices, systems, and components of these figures generally represent firmware, such as executable-code or the actions thereof; hardware, such as electronic devices, packaged modules, IC chips, or circuits; software, such as processor-executable instructions; or a combination thereof. The illustrated apparatuses 100, 800, or 900, include, for instance, a host 102, an adaptive controller 108, an interconnect 110, and a memory system 112. The host 102 can include a processor 104 and a memory controller 108. The memory system 112 may include one or more cryogenic memories 114, which include a temperature-controlled memory domain 304 that is accessible via the interconnect 110. A cryogenic memory can include a cooling device 118, voltage regulator 120, sensors 302, and/or clock circuit 706. Thus, these figures illustrate some of the many possible systems or apparatuses capable of implementing the described methods.

Computer-readable media includes both non-transitory computer storage media and communication media including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although implementations of an adaptive memory system have been described in language specific to certain features and/or methods, the subject matter of the appended claims is not necessarily limited to the specific features or methods described. Rather, the specific features and methods are disclosed as example implementations of an adaptive memory system.

The invention claimed is:

1. An apparatus comprising:
a memory array;
at least one interface configured to couple to an interconnect of a host system and receive commands issued to the memory array via the interconnect; and
an adaptive controller configured to couple to the host system via the at least one interface, the adaptive controller configured to:
receive, via the at least one interface, one or more memory performance metrics from the host system regarding the commands issued to a domain of the memory array;
determine a memory performance demand of the domain based on the one or more memory performance metrics received from the host system; and
alter at least one of a voltage setting or a temperature setting of the domain based on the memory performance demand of the domain.

2. The apparatus of claim 1, wherein:
the memory array comprises multiple memory domains that include the memory domain; and
the adaptive controller is further configured to:
receive, via the at least one interface, address information of the commands issued by the host system to the multiple memory domains of the memory array via the interconnect; and
associate, based on the address information, respective ones of the one or more memory performance metrics with ones of the multiple memory domains to which the respective memory performance metrics correspond.

3. The apparatus of claim 1, wherein the adaptive controller is further configured to:
determine an error-correcting code (ECC) scheme for data stored by the memory domain based on the voltage setting or the temperature setting that is altered; and
apply the ECC scheme to the data stored by the memory domain.

4. The apparatus of claim 1, wherein the adaptive controller is further configured to:
determine an ECC tier for data stored by the memory domain based on the voltage setting or the temperature setting that is altered; and
enable the ECC tier for the data stored by the memory domain.

5. The apparatus of claim 1, wherein the adaptive controller is further configured to:
receive, for a first interval of time, the one or more memory performance metrics of the commands issued to the memory domain;
determine, for a second interval of time, the memory performance demand of the memory domain based on the one or more memory performance metrics; and
alter, for the second interval of time, the voltage setting or the temperature setting of the memory domain based on the memory performance demand determined for the memory domain.

6. The apparatus of claim 5, wherein the adaptive controller is further configured to alter the voltage setting or the temperature setting of the memory domain prior to a start of the second interval of time.

7. The apparatus of claim 1, wherein the adaptive controller is further configured to:
compare the memory performance demand of the memory domain to a memory performance threshold of the memory domain; and
increase the voltage setting or decrease the temperature setting of the memory domain in response to the memory performance demand exceeding the memory performance threshold; or
decrease the voltage setting or increase the temperature setting of the memory domain in response to the memory performance demand not exceeding the memory performance threshold.

8. The apparatus of claim 7, wherein:
the memory performance threshold comprises a first memory performance threshold;
the memory performance demand exceeds the first memory performance threshold; and
the adaptive controller is further configured to:
determine a difference between the memory performance demand and a level of memory sensitivity indicated by the one or more memory performance metrics;
compare the difference between the memory performance demand and the level of memory sensitivity to a second memory performance threshold; and
increase the voltage setting of the memory domain in response to the difference between the memory performance demand and the level of memory sensitivity exceeding the second memory performance threshold; or
decrease the temperature setting of the memory domain in response to the difference between the memory performance demand and the level of memory sensitivity not exceeding the second memory performance threshold.

9. The apparatus of claim 8, wherein the level of memory sensitivity indicated by the one or more memory performance metrics includes:
a bandwidth sensitivity indicated by a misses per kilo instruction (MPKI) rate of a processor of the host system; or
a latency sensitivity indicated by a number of cycles for which one or more memory access instructions stall the processor of the host system.

10. The apparatus of claim 7, wherein:
the memory performance demand does not exceed the memory performance threshold; and the adaptive controller is further configured to:
compare the temperature setting of the memory domain to a temperature threshold of the memory domain; and
increase the temperature setting of the memory domain in response to the temperature setting not exceeding the temperature threshold; or
decrease the voltage setting of the memory domain in response to the temperature setting exceeding the temperature threshold.

11. The apparatus of claim 1, wherein:
the one or more memory performance metrics received from the host system comprise:
an amount of time or a number of cycles for which one or more memory read instructions associated with the memory domain are stalled in a reorder buffer; or
a misses per kilo instruction (MPKI) rate for the one or more memory read instructions associated with the memory domain; and
the memory performance demand that is determined for the memory domain comprises:
a predicted amount of time or a predicted number of stall cycles for which subsequent memory read instructions associated with the memory domain will stall in the reorder buffer; or
a predicted MPKI rate for the subsequent memory read instructions associated with the memory domain.

12. The apparatus of claim 1, wherein the adaptive controller is further configured to:
determine the memory performance demand of the memory domain based on the memory performance metrics using a moving average algorithm; or
determine the memory performance demand of the memory domain based on the memory performance metrics using a Markov prediction algorithm.

13. An apparatus comprising:
a memory array including one or more memory domains;
a host coupled to the memory array, the host including one or more performance counters that indicate a respective memory performance metric of the one or more memory domains; and
an adaptive controller comprising an interface configured to access the one or more performance counters of the processor, the adaptive controller configured to:
monitor, via the one or more performance counters of the host, the respective memory performance metric that corresponds to a memory domain of the one or more memory domains;
determine a memory performance demand of the memory domain based on the respective memory performance metric;
determine a voltage or a temperature for the memory domain based on the memory performance demand of the memory domain; and
alter a voltage setting or a temperature setting of the memory domain using the voltage or the temperature determined for the memory domain.

14. The apparatus of claim 13, further comprising an interconnect that couples the host to the memory array, and wherein:
the interface of the adaptive controller comprises a first interface;
the adaptive controller further comprises a second interface to the interconnect; and
the adaptive controller is further configured to:
monitor, via the second interface, address information of commands issued by the host to the memory array through the interconnect; and
associate, based on the address information, the respective memory performance metric with the memory domain to which the respective memory performance metric correspond.

15. The apparatus of claim 14, wherein the interconnect that couples the host to the memory array comprises:
a bus-based memory interconnect; or
a serializer/deserializer-based (SerDes-based) memory interconnect.

16. The apparatus of claim 15, wherein the SerDes-based memory interconnect is configured to implement a split-transaction memory access protocol.

17. The apparatus of claim 14, wherein the interconnect comprises multiple memory interfaces, each of the multiple interfaces coupling the host to a respective one of the one or more memory domains.

18. The apparatus of claim 17, further comprising multiple memory controllers, each of the multiple memory controllers coupling the host to a respective one of the multiple memory interfaces of the interconnect.

19. The apparatus of claim 13, wherein each of the one or more memory domains of the memory array includes:
at least one memory device configured to store data of the host;
a cooling device configured to control a temperature of the at least one memory device based on the temperature setting; and
a voltage regulator configured to control an operating voltage of the at least one memory device based on the voltage setting.

20. The apparatus of claim 13, wherein the respective memory performance metric that corresponds to the memory domain comprises:
an amount of time for which one or more memory access instructions associated with the memory domain are stalled in a reorder buffer; or
a misses per kilo instruction (MPKI) rate associated with the one or more memory access instructions associated with the memory domain.

21. The apparatus of claim 13, wherein:
data of the memory domain is encoded with an error-correcting code (ECC) scheme; and
the adaptive controller is further configured to:
select another ECC scheme for the data of the memory domain based on the voltage or the temperature determined for the memory domain;
cause a read out of the data encoded with the ECC scheme from the memory domain;
cause a re-encoding of the data read out from the memory domain using the other ECC scheme; and
cause a write back of the data encoded with the other ECC scheme to the memory domain.

22. The apparatus of claim 21, wherein the adaptive controller is configured to alter the voltage setting or the temperature setting of the memory domain after the data encoded with the other ECC scheme is written back to the memory domain.

23. The apparatus of claim 13, wherein:
data of the memory domain is encoded or decoded using a first tier of error-correcting code (ECC); and
the adaptive controller is further configured to:
enable a second tier of ECC for encoding or decoding the data of the memory domain based on the voltage or the temperature determined for the memory domain.

24. The apparatus of claim 23, wherein the adaptive controller is configured to alter the voltage setting or the temperature setting of the memory domain after enabling the second tier of ECC for encoding or decoding the data of the memory domain.

25. A method comprising:
receiving, via a host interface of an adaptive controller, one or more memory performance metrics regarding commands issued by a host to a memory domain of a memory array coupled to the host via an interconnect;
determining, by the adaptive controller, a memory performance demand of the memory domain based on the one or more memory performance metrics; and
altering, by the adaptive controller, a voltage setting or a temperature setting of the memory domain based on the memory performance demand of the memory domain.

26. The method of claim 25, further comprising:
receiving, via the host interface, address information of at least the commands issued by the host to the memory domain; and
associating the one or more performance metrics with the memory domain based on the address information.

27. The method of claim 26, further comprising:
obtaining, via an interconnect interface of the adaptive controller, the address information of the commands issued by the host to the memory domain; and
associating the one or more performance metrics with the memory domain based on the address information.

28. The method of claim 25, further comprising:
determining an error-correcting code (ECC) scheme for data stored by the memory domain based on the voltage setting or the temperature setting that is altered; and
applying the ECC scheme to the data stored by the memory domain.

29. The method of claim 25, further comprising:
determining an error-correcting code (ECC) tier for data stored by the memory domain based on the voltage setting or the temperature setting that is altered; and
enabling the ECC tier for the data stored by the memory domain.

30. The method of claim 25, wherein:
the one or more memory performance metrics received via the host interface comprise:
an amount of time or a number of cycles for which one or more memory read instructions associated with the memory domain are stalled in a reorder buffer; or
a misses per kilo instruction (MPKI) rate for the one or more memory read instructions associated with the memory domain; and
the memory performance demand of the memory domain comprises:
a predicted amount of time or a predicted number of stall cycles for which subsequent memory read instructions associated with the memory domain will stall in the reorder buffer; or
a predicted MPKI rate for the subsequent memory read instructions associated with the memory domain.

31. A method comprising:
receiving, during a first time interval, one or more memory performance metrics regarding commands issued by a host to a memory domain of a memory array coupled to the host;
predicting, for a second time interval, a memory performance demand of the memory domain based on the one or more memory performance metrics; and
altering, before or during the second time interval, a voltage setting or a temperature setting of the memory domain based on the memory performance demand of the memory domain.

32. The method of claim 31, wherein the voltage setting or the temperature setting of the memory domain is altered before a start of the second time interval.

33. The method of claim 31, wherein the memory performance demand is predicted using one of:
machine learning;
a moving average algorithm; or
a Markov prediction circuit.

34. The method of claim 31, further comprising determining at least one of the first interval of time or the second interval of time based on a voltage transition time of the memory domain or a temperature transition time of the memory domain.

35. An apparatus comprising:
a memory array including one or more memory domains;
a host coupled to the memory array, the host including one or more programs configured for quantum processing;
a control processor coupled to the memory array, the control processor including a quantum execution unit configured to manage execution of the one or more programs and one or more performance counters that indicate a respective memory performance metric of the one or more memory domains;
a quantum processing substrate coupled to the quantum execution unit of the control processor, the quantum processing substrate configured to execute the one or more programs; and
an adaptive controller comprising an interface configured to access the one or more performance counters of the control processor, the adaptive controller configured to:
monitor, via the one or more performance counters of the control processor, the respective memory performance metric that corresponds to a memory domain of the one or more memory domains;
determine a memory performance demand of the memory domain based on the respective memory performance metric;
determine a voltage or a temperature for the memory domain based on the memory performance demand of the memory domain; and
alter a voltage setting or a temperature setting of the memory domain using the voltage or the temperature determined for the memory domain.

\* \* \* \* \*